United States Patent
Tsujiuchi

(10) Patent No.: US 9,140,836 B2
(45) Date of Patent: Sep. 22, 2015

(54) METHOD OF SHIELDING ULTRAVIOLET LIGHT AND INCREASING VISIBLE LIGHT, AND ULTRAVIOLET-LIGHT-SHIELDING AND VISIBLE-LIGHT-INCREASING MATERIAL WHICH ENABLES IMPLEMENTATION OF THE METHOD

(76) Inventor: Yutaka Tsujiuchi, Akita (JP)

( * ) Notice: Subject to any disclaimer, the term of this patent is extended or adjusted under 35 U.S.C. 154(b) by 308 days.

(21) Appl. No.: 13/811,871

(22) PCT Filed: Jul. 25, 2011

(86) PCT No.: PCT/JP2011/066865
§ 371 (c)(1),
(2), (4) Date: Mar. 7, 2013

(87) PCT Pub. No.: WO2012/014847
PCT Pub. Date: Feb. 2, 2012

(65) Prior Publication Data
US 2013/0221239 A1    Aug. 29, 2013

(30) Foreign Application Priority Data

Jul. 26, 2010 (JP) .................................. 2010-166865

(51) Int. Cl.
*F21V 9/16* (2006.01)
*G01N 21/64* (2006.01)
(Continued)

(52) U.S. Cl.
CPC ............. *G02B 5/208* (2013.01); *C09K 11/06* (2013.01); *H01L 31/055* (2013.01); *C09K 2211/1088* (2013.01); *Y02E 10/52* (2013.01)

(58) Field of Classification Search
CPC ... H01L 31/055; H01L 33/502; H01L 33/504; G02B 5/208
USPC .......................................... 250/459.1, 461.1
See application file for complete search history.

(56) References Cited

U.S. PATENT DOCUMENTS 8,115,182 B1 *   2/2012   Patel ........................... 250/482.1
8,350,233 B2 *   1/2013   Ferrini et al. .............. 250/484.4
(Continued)

FOREIGN PATENT DOCUMENTS

JP    57-095675 A    6/1982
JP    63-200576 A    8/1988
(Continued)

OTHER PUBLICATIONS

"Spectroscopy and photophysics of 4- and 7-hydroxycoumarins and their thione analogs", Journal of Molecular Structure 565±566 (2001) 69-78 to Melo et al.*
(Continued)

*Primary Examiner* — David J Makiya
*Assistant Examiner* — Kenneth J Malkowski
(74) *Attorney, Agent, or Firm* — Ladas & Parry LLP

(57) ABSTRACT

Provided is a method of shielding ultraviolet light and increasing visible light, enabling shielding or removal of ultraviolet light, transmission of visible light, effective utilization of ultraviolet energy to obtain visible light, and not requiring use of rare metal thus being low in cost. The method has: a first excitation step of exciting a fluorescent material by external light of 200 nm to 330 nm: an internal light emission step in which the fluorescent material excited in the first excitation step emits internal light of 330 nm to 400 nm; a second excitation step of exciting the same or a different fluorescent material by external light of 330 nm to 400 nm and by the internal light of 330 nm to 400 nm; and a visible light emission step in which the fluorescent material excited in the second excitation step emits visible light of 400 nm or more.

18 Claims, 28 Drawing Sheets

(51) Int. Cl.
  *G02B 5/20* (2006.01)
  *H01L 31/055* (2014.01)
  *C09K 11/06* (2006.01)

(56) References Cited

U.S. PATENT DOCUMENTS

| | | |
|---|---|---|
| 2002/0041437 A1 | 4/2002 | Cornelius |
| 2003/0170467 A1* | 9/2003 | Cornelius et al. ............. 428/447 |
| 2005/0057145 A1 | 3/2005 | Shieh et al. |
| 2005/0212397 A1 | 9/2005 | Murazaki et al. |
| 2011/0140002 A1* | 6/2011 | Agrawal et al. ............ 250/458.1 |

FOREIGN PATENT DOCUMENTS

| | | |
|---|---|---|
| JP | 64-24865 U | 2/1989 |
| JP | 09-110474 A | 4/1997 |
| JP | 11-264881 A | 9/1999 |
| JP | 2000-031531 A | 1/2000 |
| JP | 2003-147351 A | 5/2003 |
| JP | 2004-504481 A | 2/2004 |
| JP | 2005-93985 A | 4/2005 |
| JP | 2005-330459 A | 12/2005 |
| JP | 2007-027271 A | 2/2007 |
| JP | 2009179623 A | 8/2009 |
| WO | 2009/053692 A1 | 4/2009 |

OTHER PUBLICATIONS

International Search Report mailed Sep. 6, 2011; PCT/JP2011/066865.

* cited by examiner

METHOD OF SHIELDING ULTRAVIOLET LIGHT AND INCREASING VISIBLE LIGHT, AND ULTRAVIOLET-LIGHT-SHIELDING AND VISIBLE-LIGHT-INCREASING MATERIAL WHICH ENABLES IMPLEMENTATION OF THE METHOD

TECHNICAL FIELD

The present invention relates to: a method of shielding ultraviolet light and increasing visible light, using a fluorescent material; and an ultraviolet-light-shielding and visible-light-increasing material which enables implementation of the method.

BACKGROUND ART

A glass given an ultraviolet-light-shielding function is used as a glass plate for buildings, a glass plate for vehicles, and a glass plate for solar cell modules and the like in order to protect a person or an object inside against damage from the ultraviolet light. As an example of such an ultraviolet-light-shielding glass, Patent Document 1 describes an ultraviolet-shielding-glass formed by layering a $ZnO$—$SiO_2$ thin film, and a $TiO_2$—$SiO_2$ thin film or $ZrO_2$—$SiO_2$ thin film on a surface of a glass substrate in a coating manner.

As a technique of shielding ultraviolet light and also effectively utilizing the energy of the ultraviolet light, Patent Document 2 describes that cerium ions having a valence of three are included in a glass substrate of a photovoltaic module, as a substance to convert the ultraviolet light into visible light.

CITATION LIST

Patent Literature

Patent Document 1: Japanese Patent Application Laid-Open (JP-A) No. 9-110474
Patent Document 2: JP-A 2007-27271

SUMMARY OF THE INVENTION

Problems to be Solved by the Invention

However, the ultraviolet-light-shielding glass of Patent Document 1 only has an ultraviolet shielding rate of approximately 50%, which is not sufficient. Additionally, the technique disclosed in Patent Document 2 is economically inefficient in that it requires use of cerium, which is a rare metal.

The present invention attempts to achieve below five objectives with the above problems taken into account:
(1) shielding or removing ultraviolet light;
(2) transmitting visible light;
(3) effectively utilizing energy of ultraviolet light to obtain visible light;
(4) not using rare metal; and
(5) keeping the cost low.

Means for Solving the Problems

The inventor conducted an intensive study to achieve the above objectives, and as a result discovered the following.
(1) A method comprising: exciting a fluorescent material by external light of 200 to 330 nm, to cause the fluorescent material to emit internal light of 330 to 400 nm; and exciting the fluorescent material by the internal light of 330 to 400 nm thus emitted, to cause the fluorescent material to emit visible light of 400 nm or more, and also exciting the fluorescent material by external light of 330 to 400 nm, to cause the fluorescent material to emit visible light of 400 nm or more.

This method makes it possible to shield ultraviolet light and to increase visible light.

Herein, ultraviolet light can be efficiently converted into visible light and thereby the visible light can be further increased, when an emission peak wavelength $\lambda_1$ (nm) of the internal light of 330 to 400 nm emitted and an excitation wavelength $\lambda_2$ (nm) at which an emission peak of the visible light is obtained when the fluorescent material excited by the internal light emits the visible light, have the following relation:

$$\lambda_1 = \text{``}\lambda_2-22\text{''} \text{ to } \text{``}\lambda_2+22\text{''}$$

(2) A fluorescent material which enables implementation of the above method alone.

(3) A method in which a first layer and a second layer are provided, the first layer having a fluorescent material which emits internal light of 330 to 400 nm by being excited by external light of 200 to 300 nm; a second layer having a fluorescent material which emits visible light of 400 nm or more by being excited by the internal light of 330 to 400 nm thus emitted and also emits visible light of 400 nm or more by being excited by external light of 330 to 400 nm; and each transmitting visible light of 400 nm or more, whereby the two layers are configured to have their individual function.

This method allows for increased options for the fluorescent material to constitute each layer and therefore enables adequate selection of the material in accordance with the purpose of use.

(4) A layered material which enables implementation of the above method in which two layers were given their individual function.

A first aspect of the present invention is a method of shielding ultraviolet light and increasing visible light, the method comprising: a first excitation step of exciting a fluorescent material by external light of 200 nm to 330 nm: an internal light emission step in which the fluorescent material excited in the first excitation step emits internal light of 330 nm to 400 nm; a second excitation step of exciting the same or a different fluorescent material by external light of 330 nm to 400 nm and by the above internal light of 330 nm to 400 nm; and a visible light emission step in which the fluorescent material excited in the second excitation step emits visible light of 400 nm or more.

It should be noted that the fluorescent material to be excited in the first excitation step and the fluorescent material to be excited in the second excitation step may be the same or different.

In the first aspect of the present invention, an emission peak wavelength $\lambda_1$ (nm) of the internal light emitted in the internal light emission step and an excitation wavelength $\lambda_2$ (nm) at which an emission peak is obtained when the fluorescent material excited in the second excitation step emits the visible light, preferably have a relation, A "$\lambda_2-22$" to "$\lambda_2+22$".

In the first aspect of the present invention, the fluorescent material is preferably a complex or mixture of 4-hydroxycoumarin and aluminum chloride.

In the first aspect of the present invention, the fluorescent material is more preferably a complex or mixture of: a compound synthesized from arginine and a coumarin pigment (the compound being sometimes referred to as "arginylcoumarin" hereinafter.); and aluminum chloride.

A second aspect of the present invention is an ultraviolet-light-shielding and visible-light-increasing material which enables implementation of the method of the first aspect of the present invention, the ultraviolet-light-shielding and visible-light-increasing material comprising: 4-hydroxycoumarin; and aluminum, chloride, or comprising: a compound synthesized from arginine and a coumarin pigment; and aluminum chloride.

The ultraviolet-light-shielding and visible-light-increasing material of the second aspect of the present invention preferably has 4-hydroxycoumarin and aluminum chloride contained in water.

The ultraviolet-light-shielding and visible-light-increasing material of the second aspect of the present invention more preferably has the compound synthesized from arginine and a coumarin pigment, and aluminum chloride contained in water.

The ultraviolet-light-shielding and visible-light-increasing material of the second aspect of the present invention is preferably gelatinous.

The ultraviolet-light-shielding and visible-light-increasing material of the second aspect of the present invention is more preferably in resin form. The "resin form" means a solidified state obtained by dispersing the ultraviolet-light-shielding and visible-light-increasing material in a resin and thereafter solidifying the resin.

The ultraviolet-light-shielding and visible-light-increasing material of the second aspect of the present invention preferably further comprises a low molecular weight alcohol. Additionally, the low molecular weight alcohol is preferably 2-propanol. However, it is not preferable for the ultraviolet-light-shielding and visible-light-increasing material to contain methanol as the low molecular weight alcohol.

A third aspect of the present invention is an ultraviolet-light-shielding and visible-light-increasing material comprising in the mentioned order from a light entering side: a first layer which emits internal light of 330 to 400 nm by being excited by external light of 200 to 330 nm; and a second layer which emits visible light of 400 nm or more by being excited by external light of 330 to 400 nm and by the internal light of 330 to 400 nm emitted in the first layer.

In the third aspect of the present invention, the first layer preferably comprises 4-hydroxycoumarin; and the second layer preferably comprises 7-hydroxy-4-methylcoumarin. Further, the layer comprising 7-hydroxy-4-methylcoumarin preferably has a pH of 7 or more and preferably has a light absorption maximum near 360 nm.

In the third aspect of the present invention, the first layer preferably comprises 4-hydroxycoumarin; and the second layer preferably comprises a complex or mixture of a fluorescent compound synthesized from arginine and a coumarin pigment, and aluminum chloride. Additionally, the second layer preferably further comprises a low molecular weight alcohol.

Effects of the Invention

According to the method of shielding ultraviolet light and increasing visible light, of the first aspect of the present invention, it is possible to shield ultraviolet light and also obtain visible light by utilizing the energy of the ultraviolet light shielded. On the other hand, visible light from outside can be directly transmitted. Thereby, visible light can be increased overall. Furthermore, the method of the present invention can be implemented with an inexpensive material, not using rare metal etc.

MODE FOR CARRYING OUT THE INVENTION

Light is divided into ultraviolet light, visible light, and infrared light, by the wavelength; and in the present invention, it is defined by its wavelength in the following way. First, a light of 200 nm to 400 nm is defined as ultraviolet light (UV), wherein the light of 200 nm to 330 nm is defined as UV-B, and the light of 330 nm to 400 nm is defined as UV-A. Additionally, a light of 400 nm to 700 nm is defined as visible light (Visible); and a light of 700 nm or more is defined as infrared light (Infrared).

<Method of Shielding Ultraviolet Light and Increasing Visible Light>

The method of shielding ultraviolet light and increasing visible light, of the present invention comprises: a first excitation step of exciting a fluorescent material by external light of 200 nm to 330 nm; an internal light emission step in which the fluorescent material excited in the first excitation step emits internal light of 330 nm to 400 nm; a second excitation step of exciting the fluorescent material by external light of 330 nm to 400 nm and by the internal light of 330 nm to 400 nm; and a visible light emission step in which the fluorescent material excited in the second excitation step emits visible light of 400 nm or more.

Figure 1:
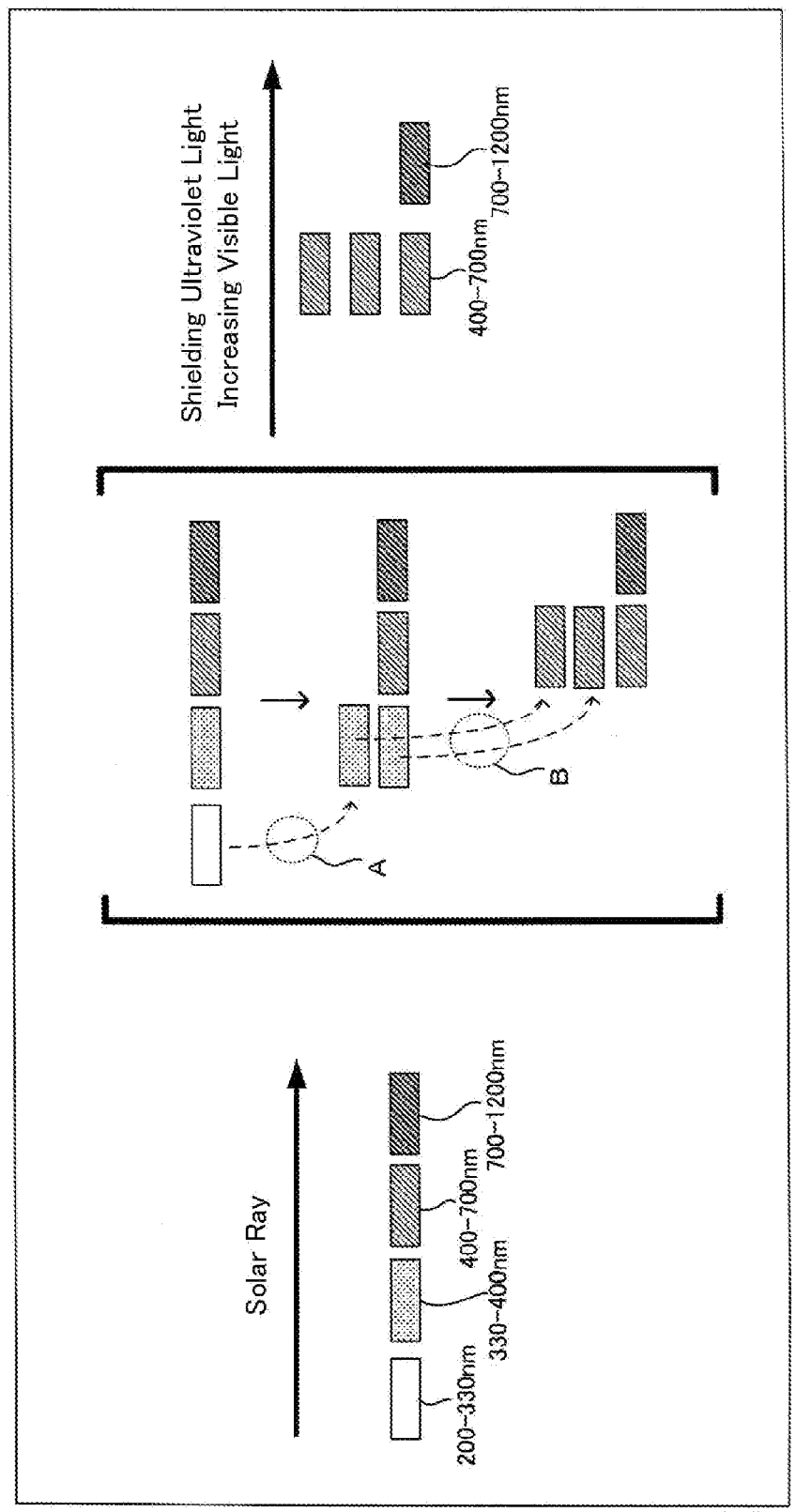
FIG. 1 is a conceptual view of the method of shielding ultraviolet light and increasing visible light, of the present invention.

Hereinafter, the method of shielding ultraviolet light and increasing visible light, of the present invention will be described with reference to FIG. 1. In FIG. 1, an ultraviolet-light-shielding and visible-light-increasing material containing a fluorescent material is placed in the bracket in the center. The solar light enters the ultraviolet-light-shielding and visible-light-increasing material from the left side of FIG. 1; light obtained as a result of shielding ultraviolet light and increasing visible light is emitted from the right side of FIG. 1. The solar light is divided into four kinds of light by the wavelength, which are UV-B (200 to 330 nm), UV-A (330 to 400 nm), visible light (400 to 700 nm), and infrared light (700 to 1200 nm).

It is shown in the bracket how the solar light is converted after entering the ultraviolet-light-shielding and visible-light-increasing material. First, the fluorescent material absorbs UV-B of the external light, and gets excited by the light (a first excitation step). The fluorescent material thus excited emits internal light of 330 to 400 nm ("A" shown in the figure). Then the fluorescent material absorbs this internal light of 330 to 400 nm and UV-A of the external light, and gets excited thereby (a second excitation step). The fluorescent light thus excited emits visible light of 400 nm or more ("B" shown in the figure). In this manner, the present invention makes it possible to not only shield ultraviolet light (UV-A and UV-B) but also convert the ultraviolet light into visible light to increase visible light.

In this way, the method of the present invention is a method for emitting visible light by carrying out the second excitation step using the internal light obtained in the first excitation step and the internal light emission step, as well as the external light. Namely, it is a method which allows for maximum utilization of ultraviolet light to obtain visible light by converting the ultraviolet light into visible light. In order to make this conversion take place efficiently, it is preferable to use a fluorescent material which allows the relation "$\lambda_1$="$\lambda_2$−22" to "$\lambda_2$+22"" to be met by an emission peak wavelength $\lambda_1$ (nm) of the internal light emitted in the internal light emission step and an excitation wavelength $\lambda_2$ (nm) at which an emission peak of the visible light is obtained when the fluorescent material excited in the second excitation step emits the visible light.

By using a fluorescent material having $\lambda_1$ and $\lambda_2$ in such a relation, it is possible to convert ultraviolet light into visible light more efficiently. In order to enable more efficient conversion, the relation between $\lambda_1$ and $\lambda_2$ is preferably $\lambda_1$="$\lambda_2$−15" to "$\lambda_2$+15"; and more preferably $\lambda_1$="$\lambda_2$−10" to "$\lambda_2$+10"

Figure 2B:
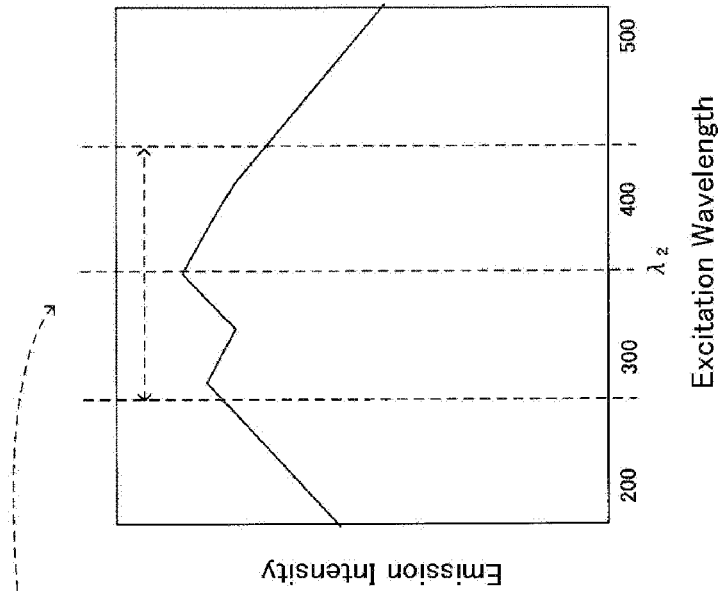
FIG. 2B is a graph of an excitation spectrum in which emission intensity of visible light obtained when the fluorescent material excited in the second excitation step emits the visible light is plotted against an excitation wavelength $\lambda_2$.
Figure 2A:
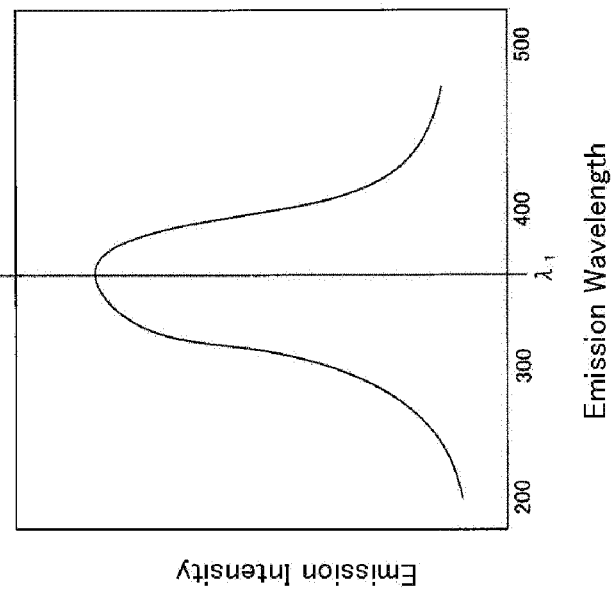
FIG. 2A is a graph of an emission intensity spectrum of the internal light emitted in the internal light emission step.

The above relation between $\lambda_1$ and $\lambda_2$ will be explained with reference to FIG. 2. FIG. 2A is an emission intensity spectrum of the internal light emitted by the fluorescent material excited in the first excitation step. A wavelength at an emission peak with the highest emission intensity is the emission peak wavelength $\lambda_1$. Additionally, FIG. 2B is an excitation spectrum in which the emission intensity of the visible light emitted by the fluorescent material excited by light (the second excitation step) is plotted against the excitation wavelength in the second excitation step. The excitation wavelength at which the visible light shows an emission peak, that is, at which the emission intensity of the visible light is the largest, is $\lambda_2$.

In the present invention, the closer the wavelength $\lambda_1$ and the wavelength $\lambda_2$ are, the more efficiently the internal light emitted can excite the fluorescent material in the second excitation step to cause the fluorescent material to emit visible light; and in this case, ultraviolet light can be converted into visible light efficiently. Therefore, it is preferable for $\lambda_1$ and $\lambda_2$ to meet the above relation.

The fluorescent material to be used in the above described method of shielding ultraviolet light and increasing visible light is not particularly limited as long as it enables implementation of this method. Preferred examples of the ultraviolet-light-shielding and visible-light-increasing material in achieving the above method will be described below.

Additionally, the above method may be implemented by using two kinds of fluorescent materials to have them take different roles in such a manner that a fluorescent material A goes through the first excitation step and the internal light emission step, and that a different fluorescent material B goes through the second excitation step and the visible light emission step.

<Ultraviolet-Light-Shielding and Visible-Light-Increasing Material>

An example of the fluorescent material which enables implementation of the above described method by itself may be a complex or mixture of 4-hydroxycoumarin (hereinafter sometimes abbreviated to 4C) and aluminum chloride; or a complex or mixture of a compound synthesized from arginine and a coumarin pigment, and aluminum chloride. An ultraviolet-light-shielding and visible-light-increasing material containing this complex or mixture will be described below.

(Coumarin Pigment)

4-hydroxycoumarin is one kind of simple coumarin compound having a below structure (1).

[Chemical Formula 1]

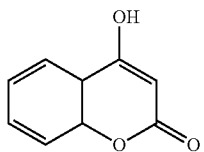

(1)

4-hydroxycoumarin is light yellow or light brown crystalline powder at room temperature. Nowadays, a thousand or more kinds of coumarin compounds are found as a natural substance or synthetic product. Among these, 4-hydroxycoumarin has a simple structure, and thus has multiple potentials for material synthesis, as exemplified by its derivative, warfarin, which is used as an anticoagulant or a rodenticide. 7-hydroxy-4-methylcoumarin (hereinafter sometimes abbreviated to 7C) shown in the below formula (2) is also one kind of simple coumarin.

[Chemical Formula 2]

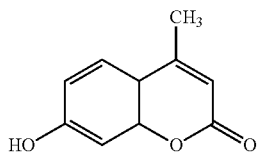

(2)

Coumarin has been used in perfume materials and the like, or used for medical purposes, and these days it is often attempted to use coumarin for an organic dye laser material utilizing the light absorbing property and the light emitting property of coumarin. Further, a case is shown that an effective material that can be a sensitizer of a dye-sensitized solar cell, which has drawn attention as being a new form of utilizing solar energy, is obtained as a coumarin derivative. In these ways, coumarin can be widely applied industrially as a material for utilizing light energy.

Figure 3:
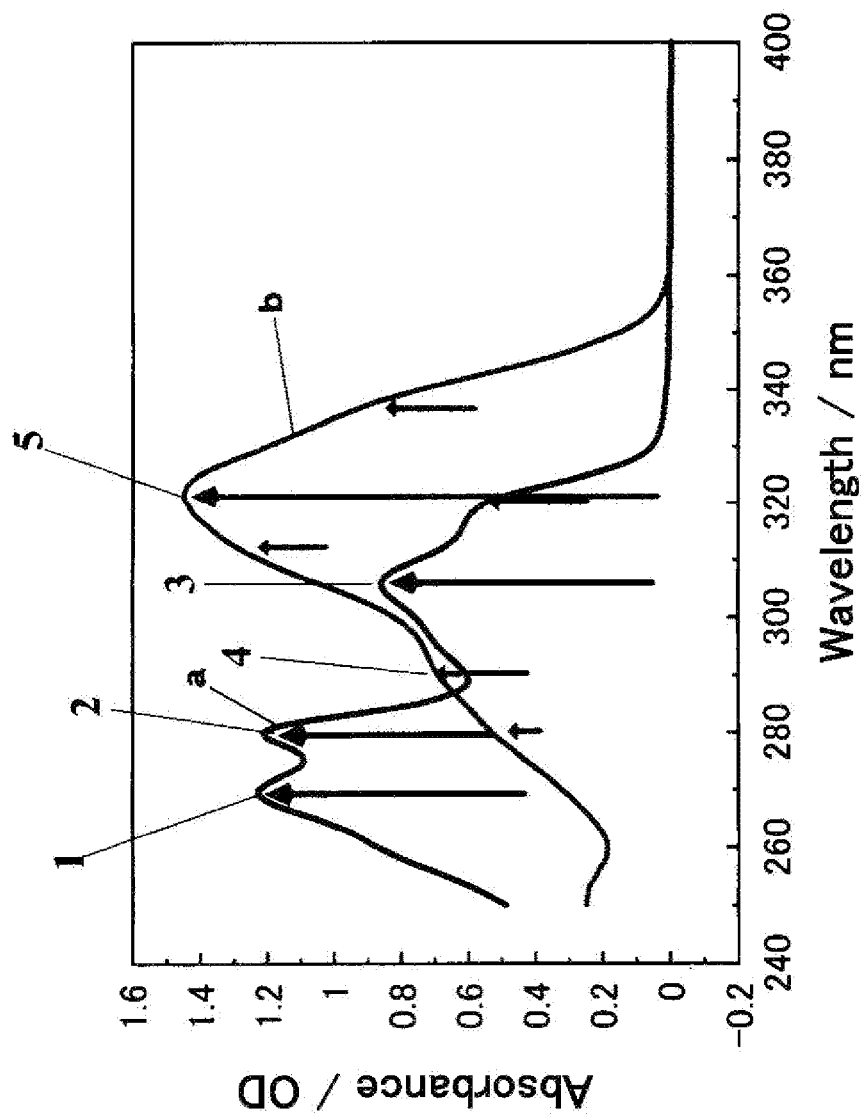
FIG. 3 is a light absorption spectrum of 4-hydroxycoumarin (a) and 7-hydroxy-4-methylcoumarin (b).

4-hydroxycoumarin has a light absorption spectrum shown by a curved line (a) in FIG. 3. According to the light absorption property shown in this spectrum, there is large light absorption in the ultraviolet part, and thus 4-hydroxycoumarin is suited for light absorption of the ultraviolet region of the solar energy. However, the spectrum has few absorption bands in the visible region of the solar energy. There are two main absorption peaks, and the wavelength regions thereof are close to each other. 7-hydroxy-4-methylcoumarin has a light absorption spectrum shown by a curved line (b) in FIG. 3. According to the light absorption property shown in this spectrum, 7-hydroxy-4-methylcoumarin is suited for light absorption of the ultraviolet region; and has a light absorption band in a wavelength slightly longer than in the case of 4-hydroxycoumarin. Nonetheless, it has few light absorption bands in the visible region. The main absorption peaks are close to each another. As can be understood from comparison of the above formulae (1) and (2), the difference in the position of the hydroxyl group (—OH) is a factor of the large difference in the spectrum. It can be seen from FIG. 3 that 7-hydroxy-4-methylcoumarin has a main absorption band at 290 nm wavelength and at 322 nm wavelength. Looking closely, absorption at 322 nm can also be seen in the spectrum of 4-hydroxycoumarin. This originates in the basic molecular structure.

In order to make a material for utilizing the solar energy effectively, a light absorption band needs to be in a wide region from an ultraviolet to visible light region. Further, in order to make a material that requires control of the wavelength, such as a memory, a spectrum property in which main absorption peaks are clearly separated is necessitated.

Additionally, control of an excitation emission peak in a fluorescent spectrum is important for a material, such as a light laser material, which uses light radiation. In order to make a material that generates high radiation energy, a fluorescent spectrum, that is, an excitation emission spectrum having a peak at a shorter wavelength is needed.

Figure 10:
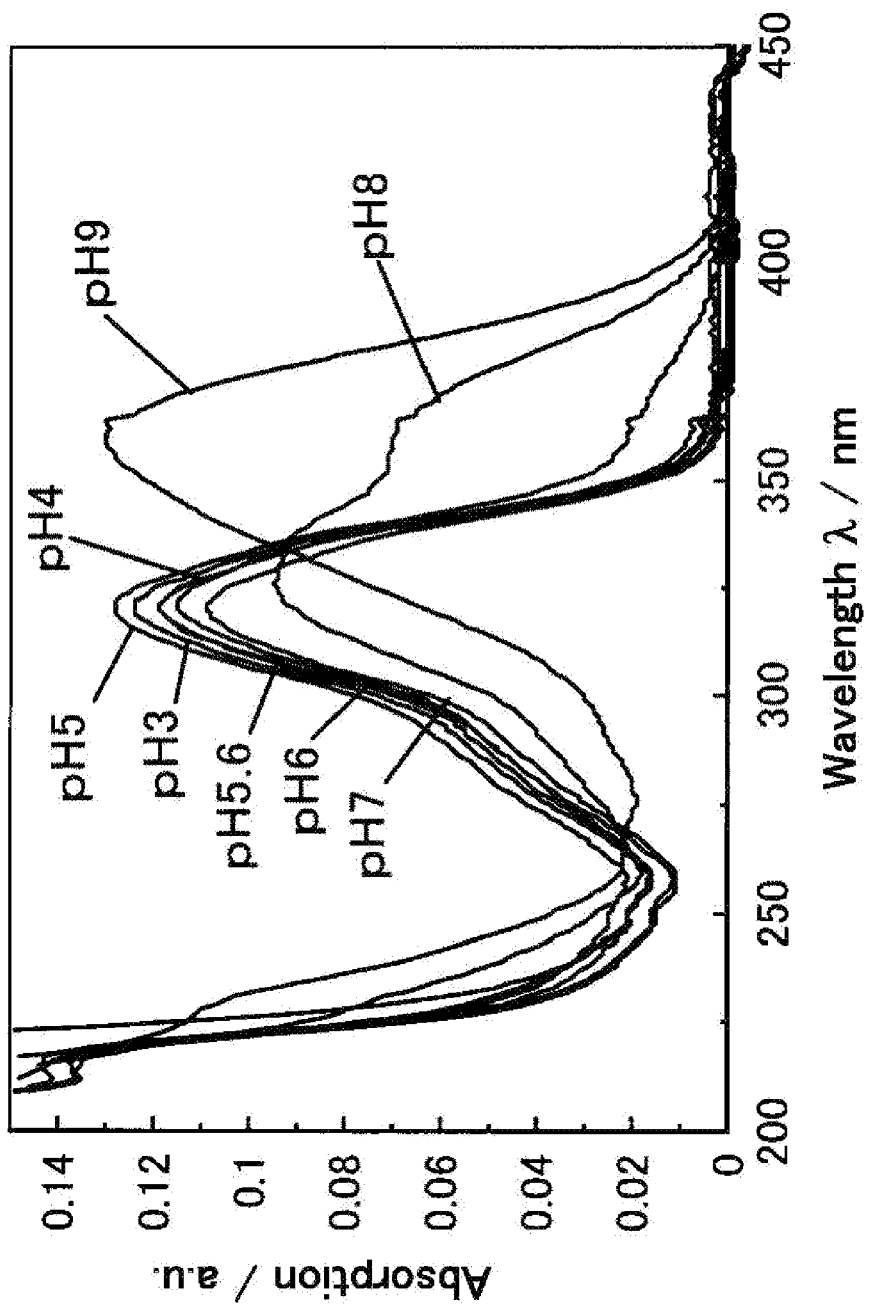
FIG. 10 is a graph showing pH dependency of a light absorption spectrum of a 7-hydroxy-4-methylcoumarin aqueous solution.
Figure 11:
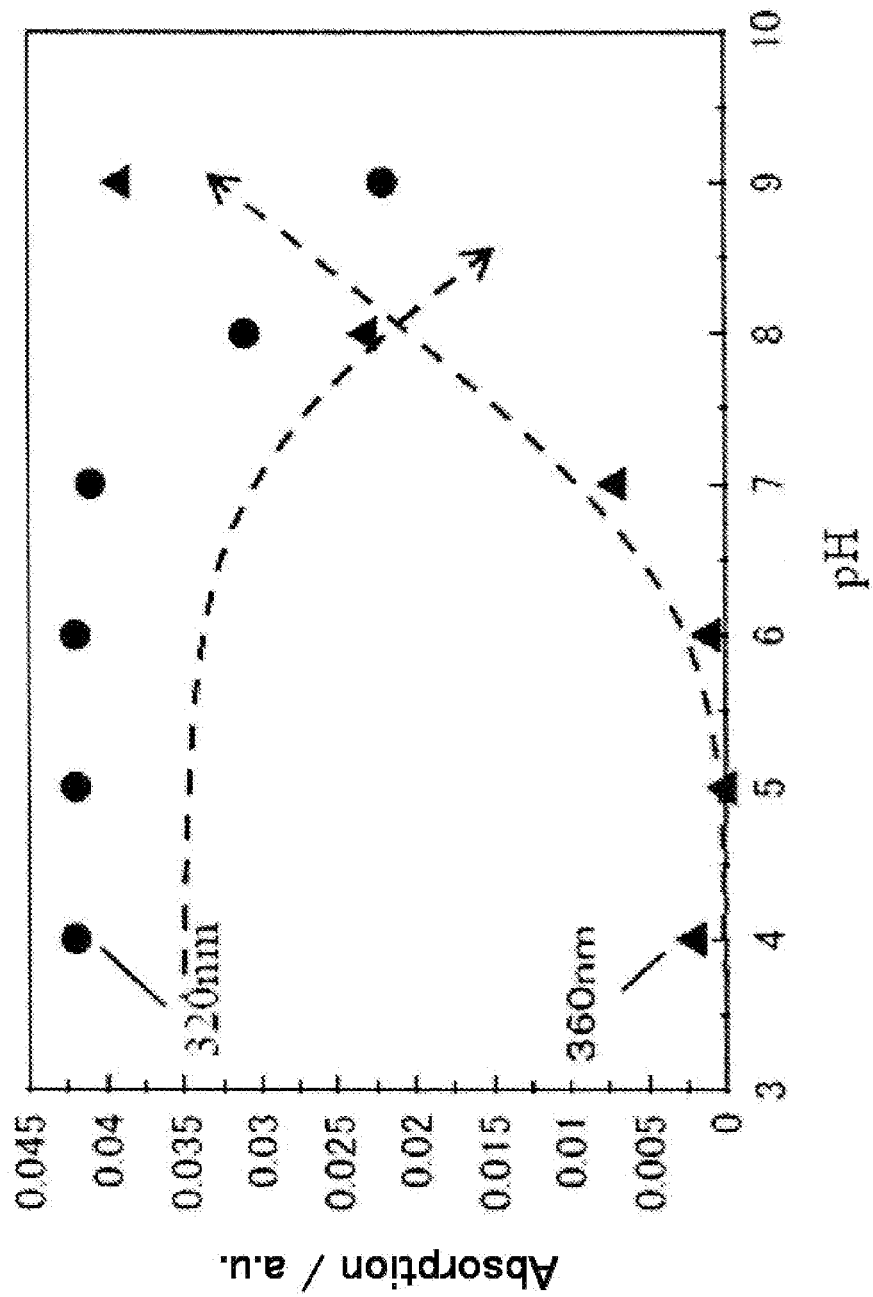
FIG. 11 is a graph showing absorption intensity of a 7-hydroxy-4-methylcoumarin aqueous solution, at 320 nm (●) and 360 nm (▲) in relation to pH.

FIG. 10 shows pH dependency of a light absorption spectrum of a 7-hydroxy-4-methylcoumarin aqueous solution. Additionally, FIG. 11 shows the absorption intensity at 320 nm (●) and at 360 nm (▲), in relation to the pH. It can be understood from this that: when the pH is less than 7, an absorption peak appears near 320 nm; and when the pH is 7 or more, an absorption peak appears near 360 nm. It can also be understood that as the pH increases, the absorption at 320 nm decreases and on the other hand the absorption at 360 nm increases.

Figure 12:
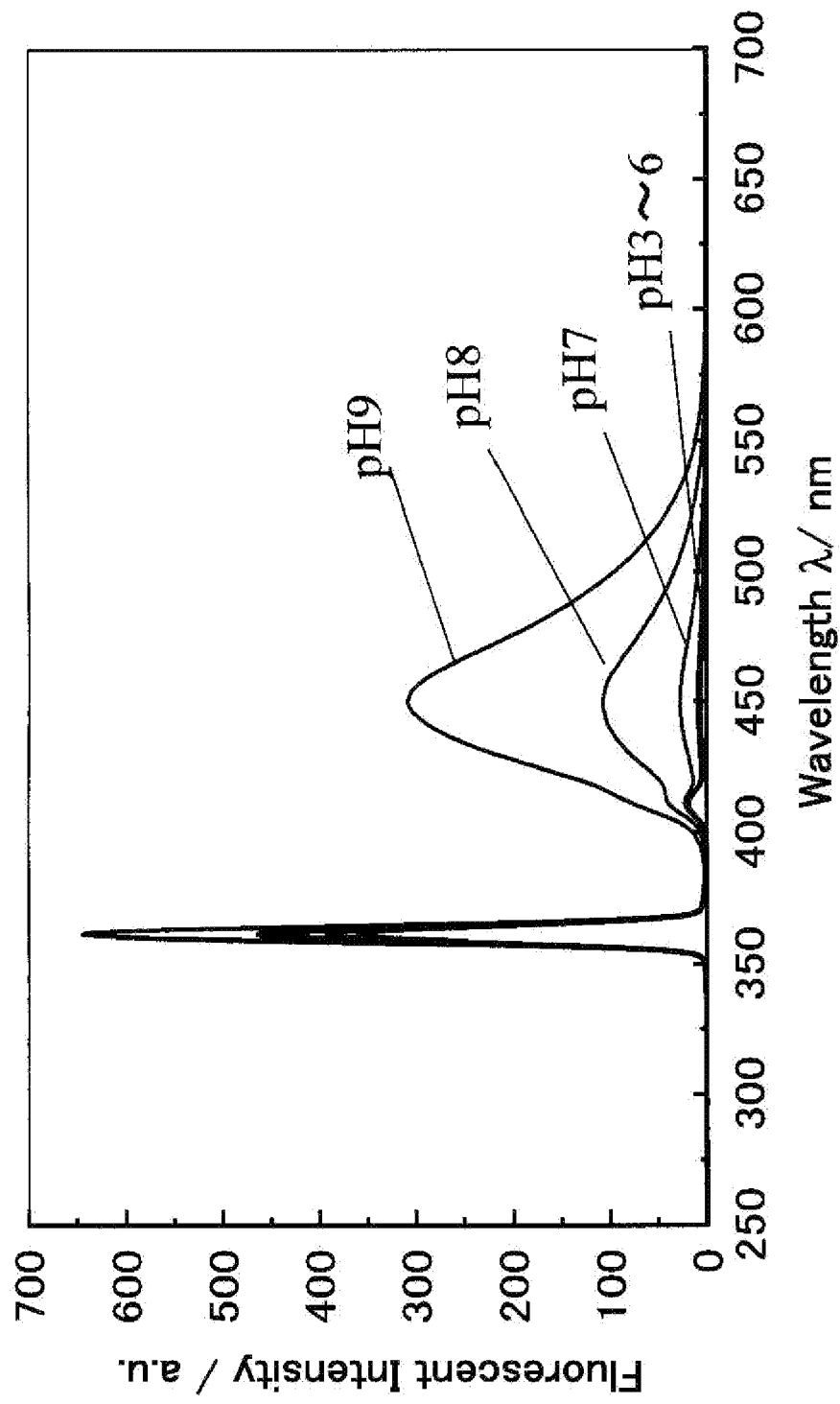
FIG. 12 is a graph showing a fluorescent spectrum in a case of exciting a 7-hydroxy-4-methylcoumarin aqueous solution by light of 360 cm.

FIG. 12 shows a fluorescent spectrum obtained in a case of exciting the 7-hydroxy-4-methylcoumarin aqueous solution by the light of 360 nm. It can be understood that the fluorescent peak wavelength is 450 nm, and that as the pH increases, the fluorescent intensity increases.

(Arginine)

Arginine is one kind of basic amino acid having a below structure (3).

[Chemical Formula 3]

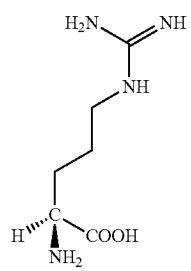

(3)

Arginine is an α-amino acid having $CH_2CH_2CH_2NH(C=NH)NH_2$ in the side chain R; is an amino acid with a charged polar side chain; and is a basic amino acid (having the highest basicity among the amino acids that constitute protein). The structure of the side chain R is meant to form a polymer compound which is different from ordinary polypeptide. That is, it is meant to form a polymer such as polyarginine, which is polymerized via an amino group in the side chain, not in the main chain. There are various kinds of polyamino acid, such as glutamic acid polymerized via a carboxylic group in the side chain. There are various applications of arginine, other than for food or medicine, for example as a biodegradable plastic, enzyme polymerized hydrogel, or an injectable biomaterial, for a cell scaffolding material, DDS matrix, biomedical hemostatic agent, or adhesive.

(Compound Synthesized from Arginine and 4-Hydroxycoumarin)

The inventor predicted that if any group of atoms in a coumarin molecule was removed and arginine was bonded to the removed part, the electron density distribution might vary significantly and there might occur a large change in the energy value in the light absorption process. The inventor also predicted that the method of microwave synthesis, which is effective in chemical synthesis of coumarin and amines, might work effectively for reaction between arginine and 4-hydroxycoumarin. The reason is that although an amino acid and amines have different functions, they both have an amino group in their structure.

In the present invention, arginine and a coumarin pigment were reacted with each other by microwave irradiation. The microwave used for chemical synthesis in the present invention is an electromagnetic wave having a wavelength of 0.3 mm to 30 cm and a frequency of 1 GHz to 1 THz. The oscillating electric field and oscillating magnetic field of the microwave interact with the permanent and induced dipole or the electric charge in a material, thereby causing heat generation at the molecular level and performing direct heating of the material. When microwave irradiation is used for chemical reactions, it is possible to promptly perform: uniform direct heating not by thermal conduction or convection; selective heating of only a material that interacts with microwave; pulse; and precise control of a heating mode by continuous irradiation. Further, it allows for heating not affected by a wall of a reactor or movement of a material and not influenced by appropriateness of thermal conduction, thereby enabling a precise reaction control process that cannot be achieved by heating from an external heat source.

A fluorescent compound according to the present invention and a production method thereof will be described below in detail with reference to drawings. As to the ultraviolet visible light absorption of an aqueous solution containing only arginine, which is the amino acid used for the reaction, there is only an absorption wavelength band in the ultraviolet part near 207 nm.

An experiment was conducted to see if arginine and 4-hydroxycoumarin would react with each other when mixed together at a mole ratio of 1:1. The results of the light absorption spectrum of a sample obtained by mixing arginine and 4-hydroxycoumarin at a mole ratio of 1:1 (the concentration of each being 0.2 mM) were obtained as shown by 1 in FIG. 4. Only an absorption maximum was observed at 205 nm, 286 nm, and 299 nm. This was almost the same as the maximum wavelength 206 nm, 286 nm, and 300 nm of 4-hydroxycoumarin. As such, only the existence of 4-hydroxycoumarin was confirmed. The light absorption band of arginine and the light absorption band of 4-hydroxycoumarin with a peak at 205 nm mostly overlap with each other. It was found from this experiment that arginine and 4-hydroxycoumarin did not react with each other just by being mixed with each other.

Figure 4:
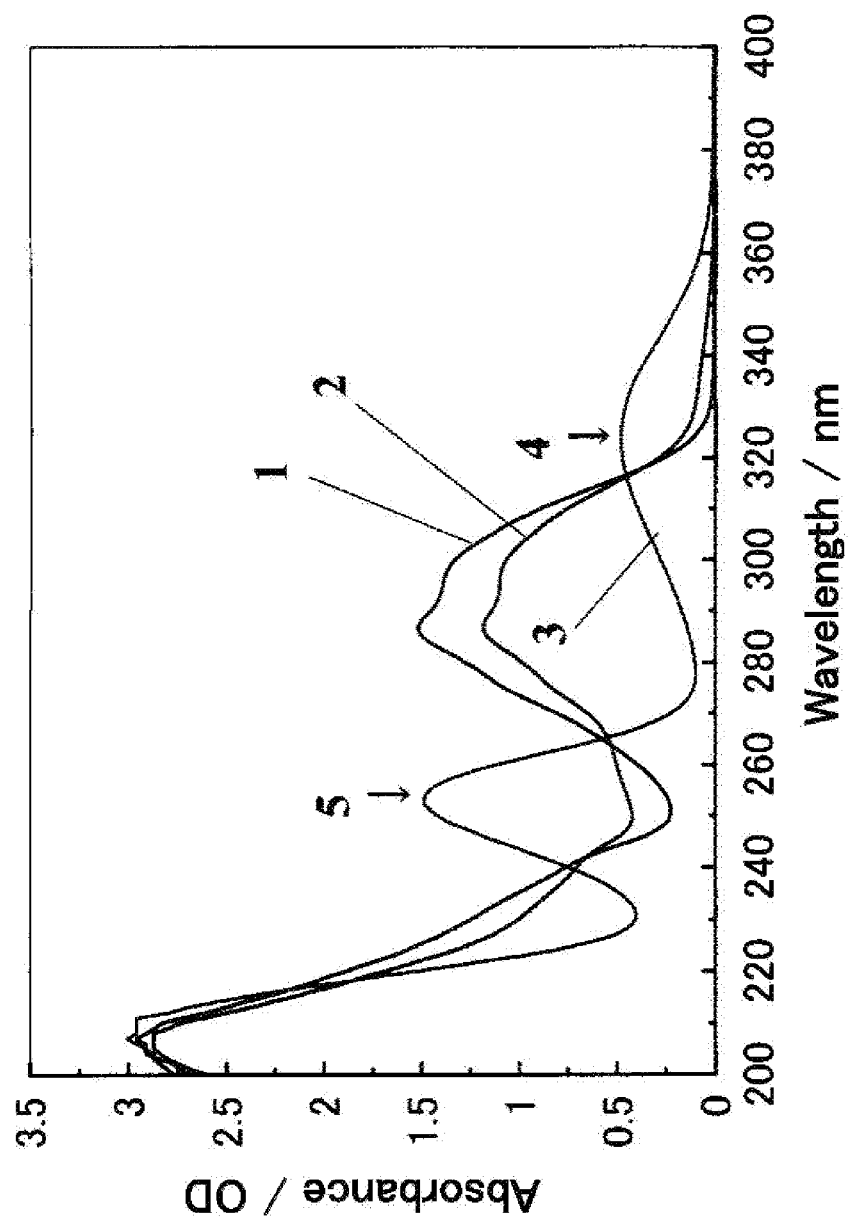
FIG. 4 is a light absorption spectrum before and after irradiating microwave to a mixture of 4-hydroxycoumarin and arginine.
Figure 9:
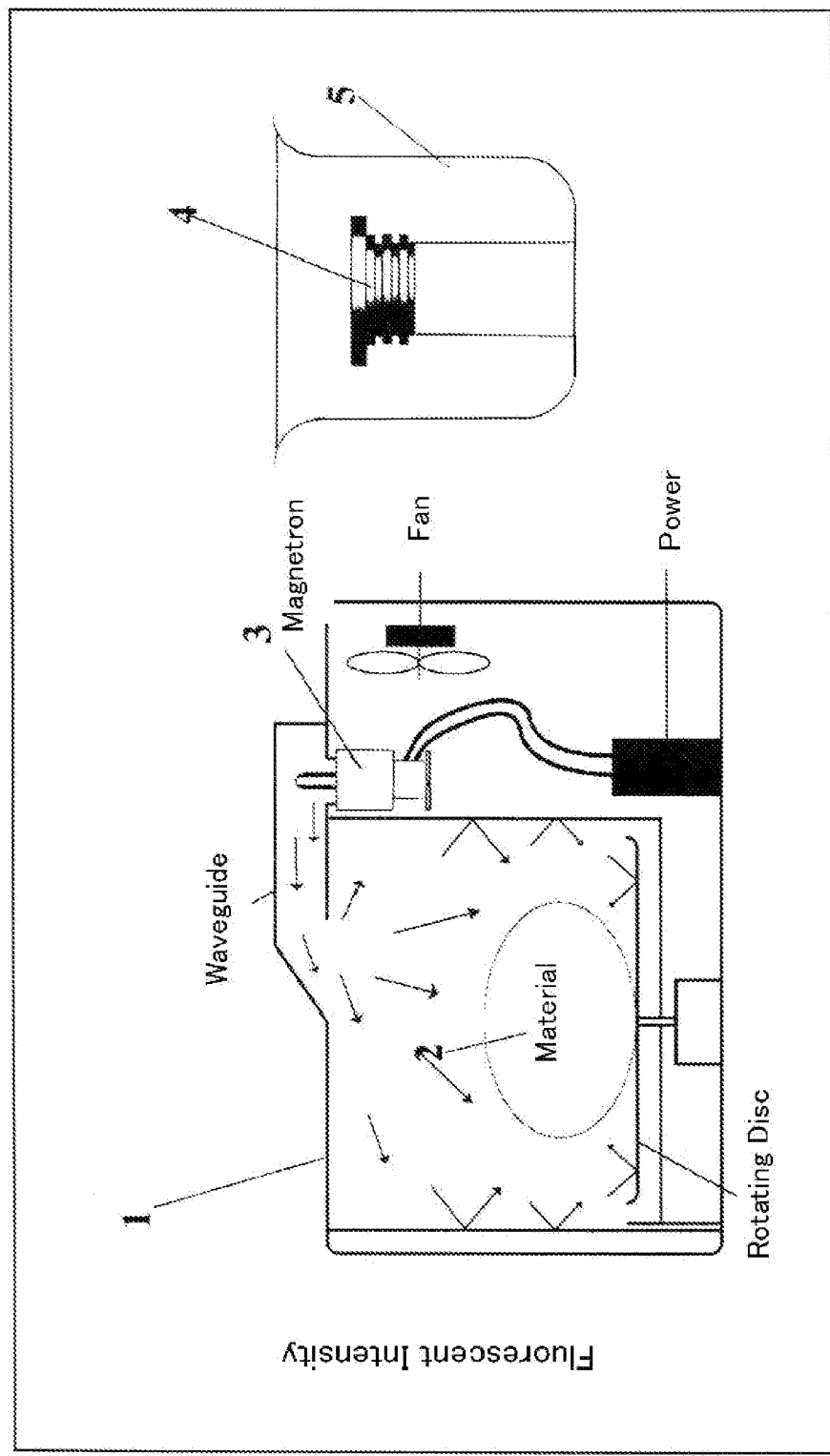
FIG. 9 is a schematic view of a microwave application device.

Next, a case will be explained in which 5 mL of mixed solutions in three different stages of concentration were each put into a high pressure-resistant glass tube (manufactured by ACE Co., Ltd.) having a volume of 15 mL and a maximum pressure resistance of 1400 kPa; and were given microwave irradiation individually for four minutes. FIG. 9 is a schematic view of a microwave application device. The numeral 1 is a main body of a microwave oven. The numeral 2 is a part in which a material to be irradiated is disposed. The numeral 3 is a magnetron which generates microwave. The numeral 4 is a high pressure-resistant glass tube. The numeral 5 is a beaker. An ordinary household microwave oven (2.45 GHz; about 900 W) was used as the microwave application device. The high pressure-resistant glass tube 4 with the beaker 5 in it was disposed in the part 2 of the microwave oven 1 to place a material to be irradiated. Then microwave was irradiated to the material. FIG. 4 shows a light absorption spectrum before and after microwave irradiation. The line 1 shows a spectrum before the irradiation as mentioned above. The line 2 shows a spectrum after two-minute irradiation. The line 3 shows a spectrum after four-minute irradiation. Absorption was not observed in the visible wavelength region; and an absorption maximum was observed at 208 nm, 287 nm, and 300 nm. These are almost the same as the maximum wavelengths 207 nm, 286 nm, and 299 nm of 4-hydroxycoumarin. This confirmed the presence of 4-hydroxycoumarin. With application of microwave, the absorbance in the absorption region unique to 4-hydroxycoumarin decreased, whereas the absorbance near 253 nm and 331 nm increased. It can be seen that this occurred because there was some reaction between arginine and 4-hydroxycoumarin, causing the absorption maximum to shift.

Figure 5:
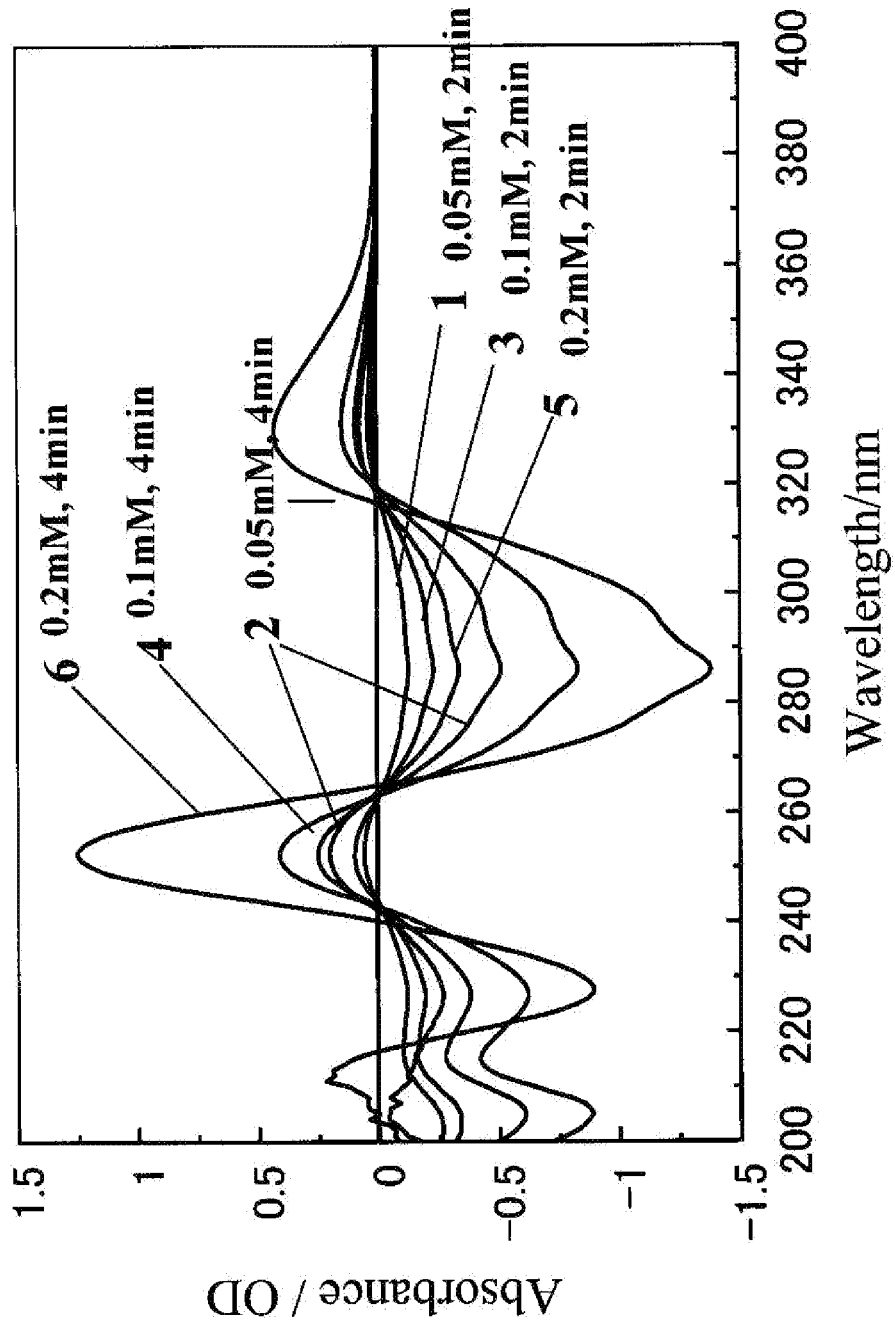
FIG. 5 is a light absorption spectrum (difference spectrum) before and after irradiating microwave to a mixture of 4-hydroxycoumarin and arginine.

In the case of performing this microwave application for two minutes, although there were changes in the absorption spectrum, the changes in the absorption value were small as shown in the line 2 in FIG. 4. In order to take a close look at the changes, comparison was made in terms of the three stages of concentration and the three stages of reaction time, in the form of a difference spectrum, as shown in FIG. 5. It was seen from this comparison that the absorbance at 286 nm decreased by 0.125 in the sample of 0.05 mM (the line 1 in FIG. 5). With a standard curve of 4-hydroxycoumarin solution separately obtained experimentally, and when an absorbance is defined as y and a concentration is defined as x, the relation is seen to be approximated by the function $y=54.44x+0.055$, in the concentration of 0.01 mM to 0.04 mM.

Accordingly, with $\Delta y=-0.125$, the following can be obtained:

$$\Delta y = -0.125 = 54.44 \Delta x;$$

$$\Delta x = -2.30 \times 10^{-3} \text{ mM}$$

Namely, it means that in the sample of 0.05 mM, 4-hydroxycoumarin decreased by $2.30 \times 10^{-3}$ mM, and it is seen that $(2.30 \times 10^{-3}/0.05) \times 100 = 4.6\%$ of the total amount reacted. Likewise, the reaction rate was: 4.2% in the sample of 0.1 mM (the line 3 in FIG. 5); and 3.1% in the sample of 0.2 mM (the line 5 in FIG. 5) (there was a large error because the absorbance largely exceeded 0.25 to 0.7). It can be seen from the above that with microwave irradiation for two minutes, nearly 4% of 4-hydroxycoumarin reacted. In the case of microwave irradiation for four minutes, there were dramatic changes as shown by the line 3 in FIG. 4 and by the line 6 in FIG. 5; and therefore it is seen that 90% or more reacted.

FIG. 5 is a graph obtained by calculating a difference spectrum from the light absorption spectrum data before and after this reaction. FIG. 5 shows a difference spectrum of ultraviolet visible light absorption of an aqueous solution containing arginine and 4-hydroxycoumarin. The lines 1 and 2 show the case of 0.05 mM concentration. The lines 3 and 4 show the case of 0.1 mM concentration. The lines 5 and 6 show the case of 0.2 mM concentration.

Absorption was not observed in the visible wavelength region; and an absorption maximum was seen near 208 nm, 253 nm, and 330 nm. Comparing these with the maximum wavelengths 207 nm, 286 nm, and 299 nm of 4-hydroxycoumarin, only the short wavelength 208 nm was approximately the same as the maximum wavelength of 4-hydroxycoumarin; and none of the other matched the maximum wavelength of 4-hydroxycoumarin, showing shifting of the absorption maximum.

Further, in the case of the two-minute microwave irradiation, it is seen that approximately 4% reacted. However, in the case of the four-minute microwave irradiation, the absorption band near 286 nm and 300 nm, which is an absorption region of 4-hydroxycoumarin, mostly shifted; and therefore, it is understood that most have reacted as explained above. The reaction rate increased significantly from the case of the two-minute microwave irradiation to the case of the four-minute microwave irradiation. It is seen from the above that this reaction process progresses rapidly under a certain high-temperature and high-pressure condition.

It was also confirmed that when this reaction was further continued for over four minutes, even the high pressure-resistant glass tube 4 could not endure the pressure generated and resulted in breakage. The experiment was conducted under various conditions and the following were confirmed.

When the high pressure-resistant glass tube 4 is directly put in the beaker 5, the reactant mostly turns into a product with four-minute irradiation. After that, since there is no chance for the energy to be consumed in the chemical reaction, the energy fills up the inside of the high pressure-resistant glass tube 4, causing rapid increase in the pressure and as a result breaking of the high pressure-resistant glass tube 4.

When a similar reaction is carried out with powder of aluminum oxide included in the beaker 5, the reaction product gets saturated with two-minute irradiation, which is the half irradiation time; and the breaking starts. It is thought that this is caused by efficient transmission of the microwave energy to the reactant.

Even when the reaction product is kept for a long period of ten months or more, it remains stable and does not turn back to arginine and 4-hydroxycoumarin, which are the original substances.

Two significant features of the synthetic product obtained by this chemical synthesis are seen in the absorption spectrum thereof. One is that the absorption maximum near 286 nm and 300 nm wavelength, which is unique to 4-hydroxycoumarin, has disappeared, shifting to a longer wavelength 324 nm. The other feature is that there is shifting of the absorption maximum to a shorter wavelength 253 nm. Based on the observation that when a chain of molecules becomes long, there occurs a large change in the absorption process as a result of a change in the electrical symmetry, causing the absorption maximum wavelength to shift to a longer wavelength, the reason for the above features is thought to be that 4-hydroxycoumarin and arginine have reacted, and the reaction has produced a long chain. Additionally, as in the substitution reaction of the hydroxyl group (—OH) of 4-hydroxycoumarin by the —NH group of amine under the microwave irradiation reported in a document, it is thought that heat catalysis by microwave may be the cause of substitution reaction with dehydration of the —NH group of arginine and the hydroxyl group of 4-hydroxycoumarin. A chemical structure assumed is shown in the below formula (4).

[Chemical Formula 4]

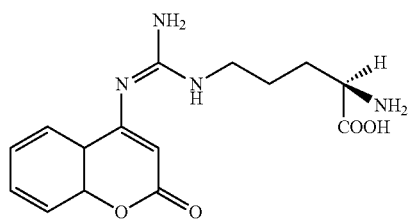

(4)

When it is assumed that there has occurred substitution reaction with dehydration of the hydroxyl group (—OH) of 4-hydroxycoumarin with: the hydrogen H of the —$NH_2$ group in the main chain of the arginine molecule; the hydrogen H of the —$NH_2$ group in the side chain of the arginine molecule; or the hydrogen H bonded to the nitrogen N in the fourth position from the asymmetric carbon atom, the compounds represented by the below formulae (5), (6), (7), respectively are obtained.

[Chemical Formula 5]

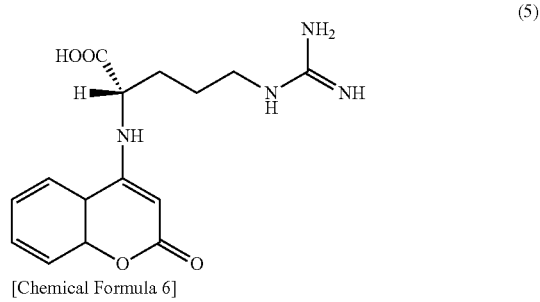

(5)

[Chemical Formula 6]

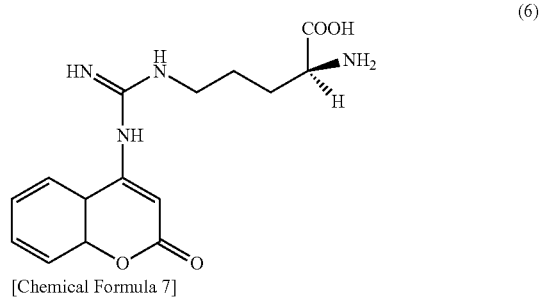

(6)

[Chemical Formula 7]

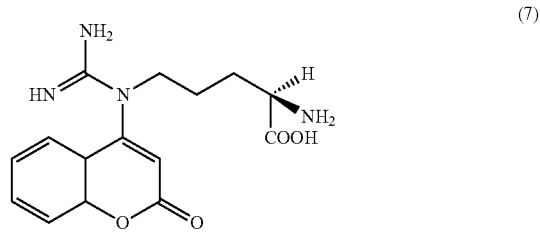

(7)

All of these can be called a compound synthesized from arginine and 4-hydroxycoumarin (tentatively called arginylcoumarin)

Figure 8:
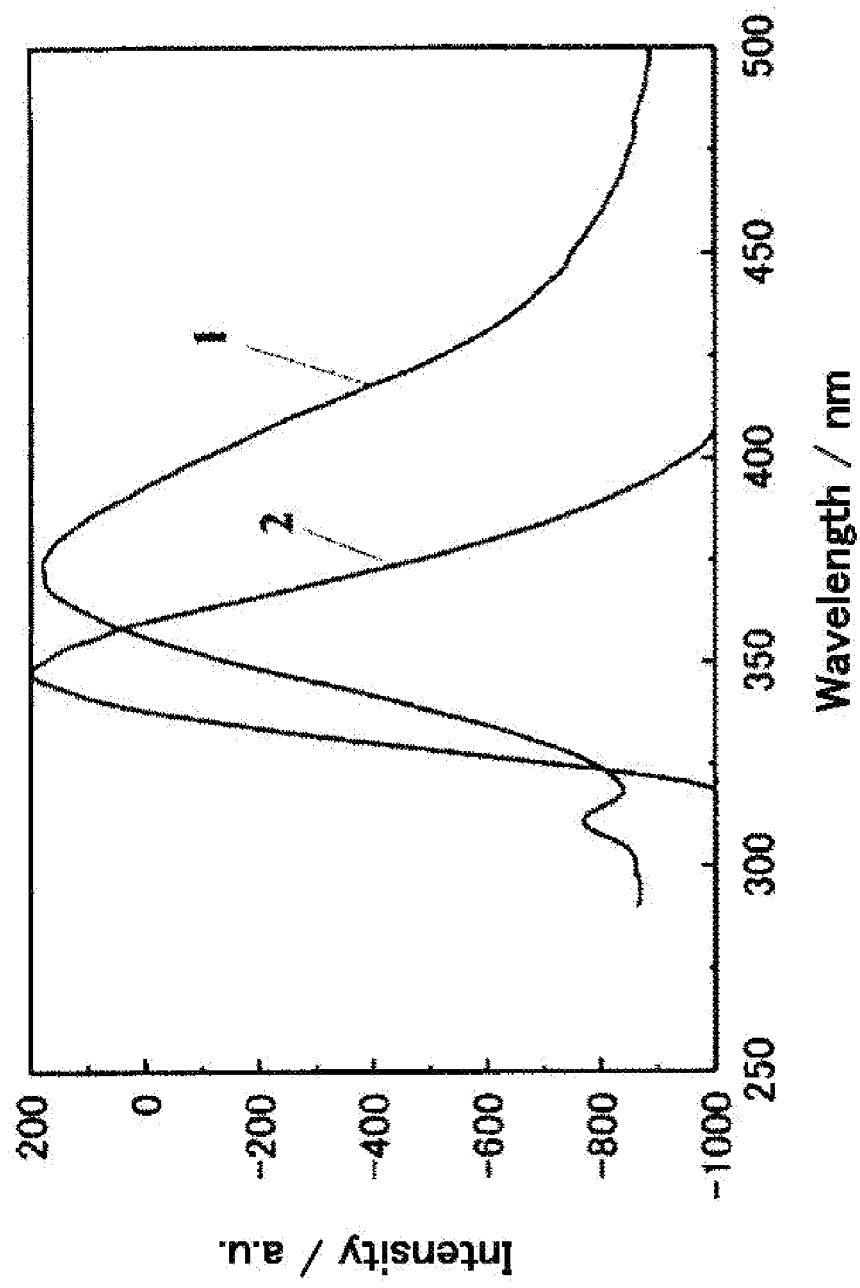
FIG. 8 is an excitation emission spectrum of 4-hydroxycoumarin and arginylcoumarin.

Next, an excitation emission spectrum of the product, arginylcoumarin obtained was measured, which is shown in FIG. 8. The line 1 is an excitation emission spectrum of a mixture of arginine and 4-hydroxycoumarin before microwave irradiation. The line 2 is an excitation emission spectrum of the product generated. It was seen that although there was a maximum of emission intensity near 374 nm before the reaction, the emission intensity maximum point of the product, arginylcoumarin shifted toward a shorter wavelength 348 nm, by as much as 26 nm. Therefore, it is clear that the product, arginylcoumarin has a characteristic of releasing photons having energy higher than that of 4-hydroxycoumarin as an original substance.

(Complex of Arginylcoumarin and $AlCl_3$)

Figure 14:
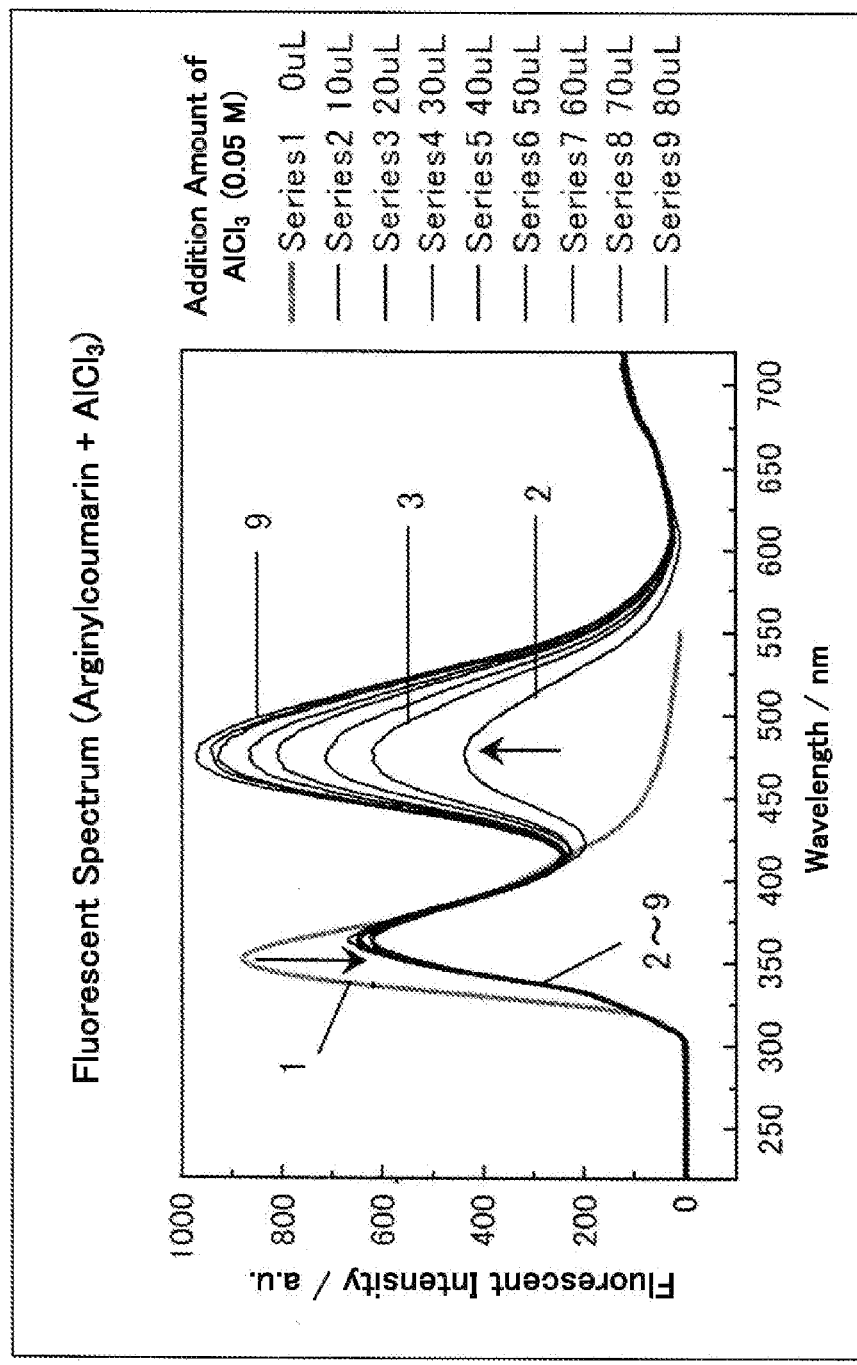
FIG. 14 is a graph showing a fluorescent spectrum of a mixed solution of arginylcoumarin and $AlCl_3$ (in Series 1 to 9 where the addition amount of $AlCl_3$ varies).

Next, 5 μL of arginylcoumarin of 0.22 mM was added to 2995 μL of distilled water, to have an amount of 3000 μL in total; and $AlCl_3$ of 0.05 M was added to the mixture in increments of 10 μL. Then, an emission spectrum by excitation at 280 nm was measured. The results are shown in FIG. 14. In the case of not adding $AlCl_3$ (Series 1), an emission spectrum having an emission maximum at 348 nm was obtained. When AlCl₃ was added, this spectrum exhibited decrease in the intensity and shifting toward a longer wavelength, resulting in an emission spectrum having an emission maximum at 363 nm and 475 nm. This shifting to a longer wavelength from 348 nm to 363 nm and this intensity decrease is the result of pH changes that occur due to increase in chlorine ions. On the other hand, the emission increase of 475 nm indicates that: the complex excited by the light of 280 nm emits light having an emission maximum at 363 nm; this emitted light functions as an excitation light to excite the complex; and the complex excited emits light (in light blue) having an emission maximum at 475 nm (in this description, "light blue" may be turquoise blue, which is a mixed color of blue and green).

That is, the complex excited in the first excitation step emits light having an emission maximum at 363 nm, which is internal light (internal light emission step); and in the second excitation step, the complex gets excited by this internal light, and the complex thus excited emits visible light having an emission maximum at 475 nm (visible light emission step). In this way, the complex of arginylcoumarin and AlCl₃ is a compound which can alone carry out the method of shielding ultraviolet light and increasing visible light.

Further, it can be seen from FIG. 14 that when AlCl₃ is further added, the emission intensity at the 475 nm peak increases.

Figure 15:
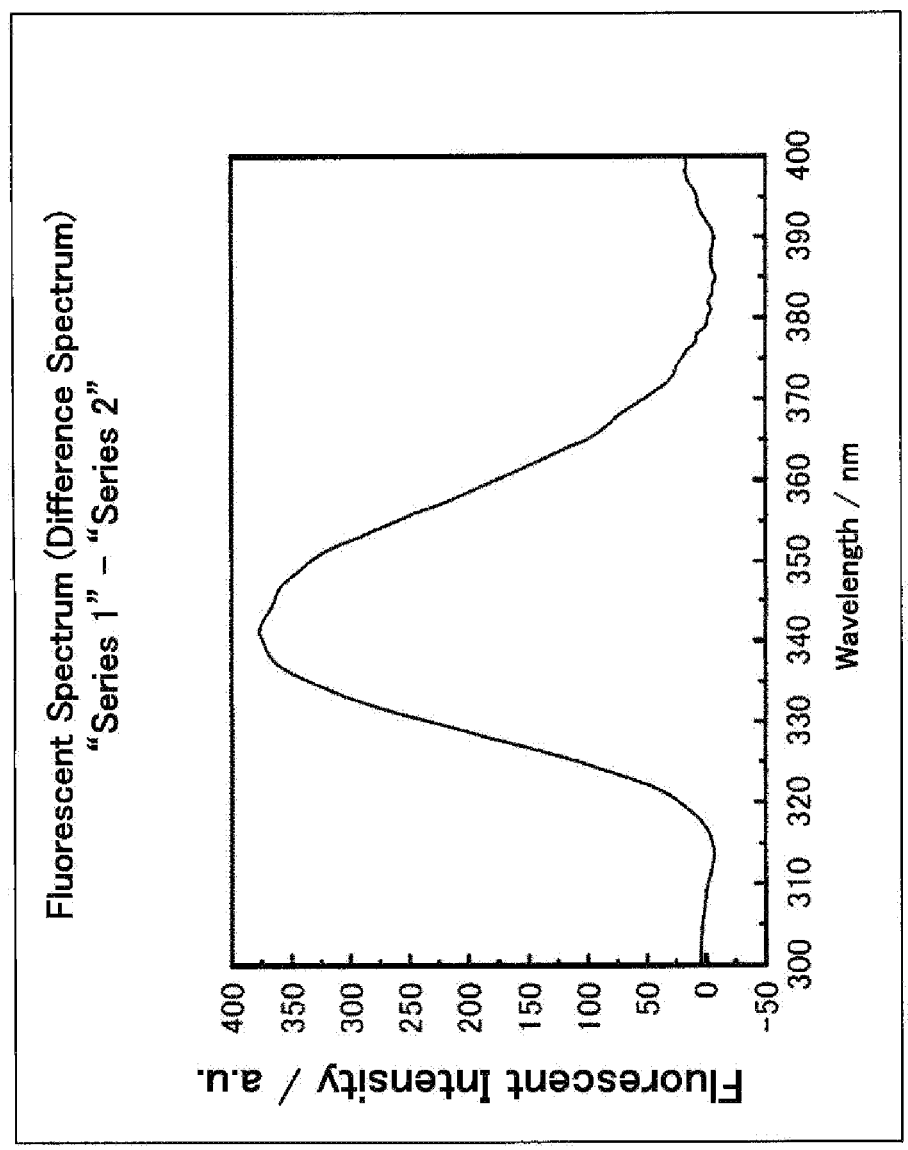
FIG. 15 is a graph showing a difference spectrum in which Series 2 is subtracted from Series 1.

FIG. 15 shows a difference spectrum obtained by subtracting the spectrum (Series 2) of the case in which 10 of AlCl₃ was added to arginylcoumarin, from the spectrum (Series 1) of the case of the arginylcoumarin only. This clearly shows that with addition of AlCl₃, emission of the 348 nm peak unique to arginylcoumarin has disappeared.

Figure 16:
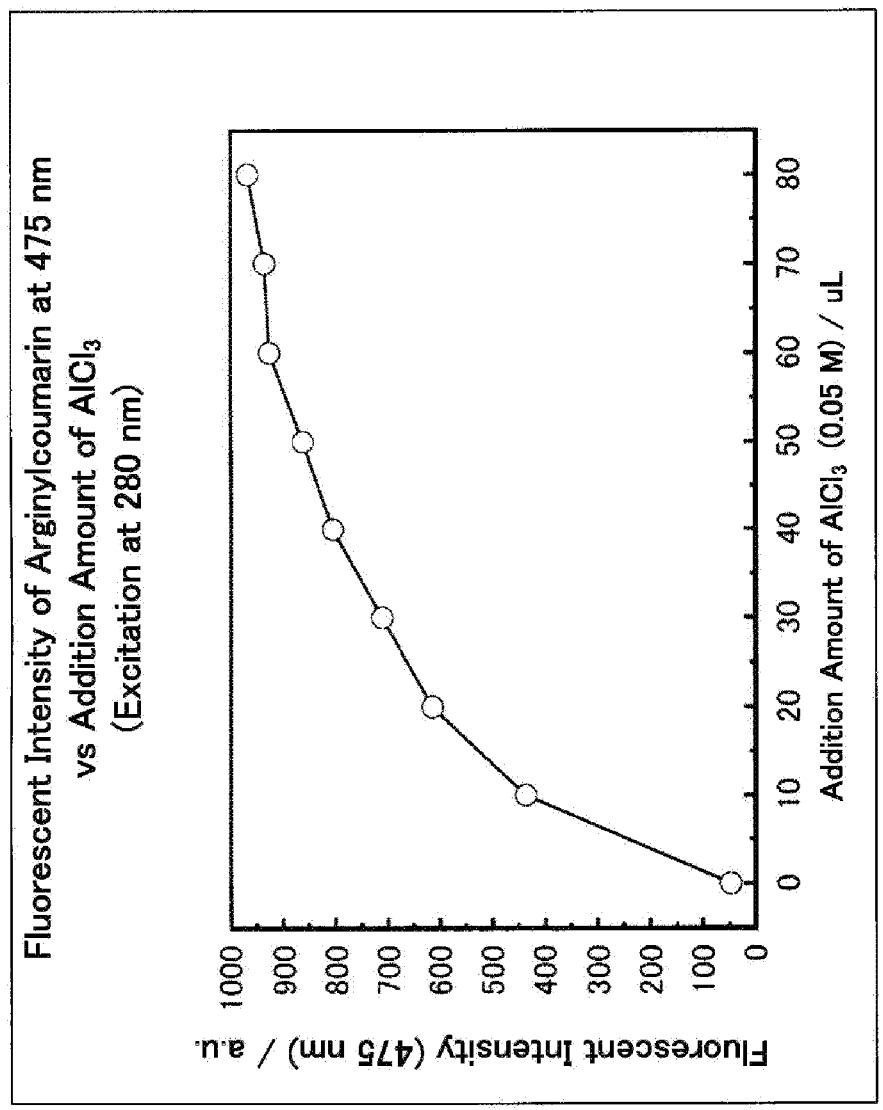
FIG. 16 is a graph showing fluorescent intensity of arginylcoumarin at 475 nm versus an addition amount of $AlCl_3$ (excitation at 280 nm).

FIG. 16 shows a graph in which the emission intensity at 475 nm, shown in FIG. 14, obtained by exciting the aqueous solution of the complex of arginylcoumarin and AlCl₃ through irradiation of the light of 280 nm thereto, is plotted against the addition amount of AlCl₃. This shows that with increase in the amount of AlCl₃ added, the emission intensity of the complex increases. Further, when the addition amount of AlCl₃ increases, increase in the emission intensity tends to peak out. From above, in the complex of arginylcoumarin and AlCl₃, the addition amount of AlCl₃ in relation to the amount of argininylcoumarin is preferably 5,000 times or more at a mole ratio, more preferably 10,000 times or more, and still more preferably 20,000 times or more. In addition, in view that increase in the emission intensity peaks out, the upper limit of the addition amount of AlCl₃ in relation to the amount of argininylcoumarin is preferably 60,000 times or less, and more preferably 50,000 times or less.

Figure 17:
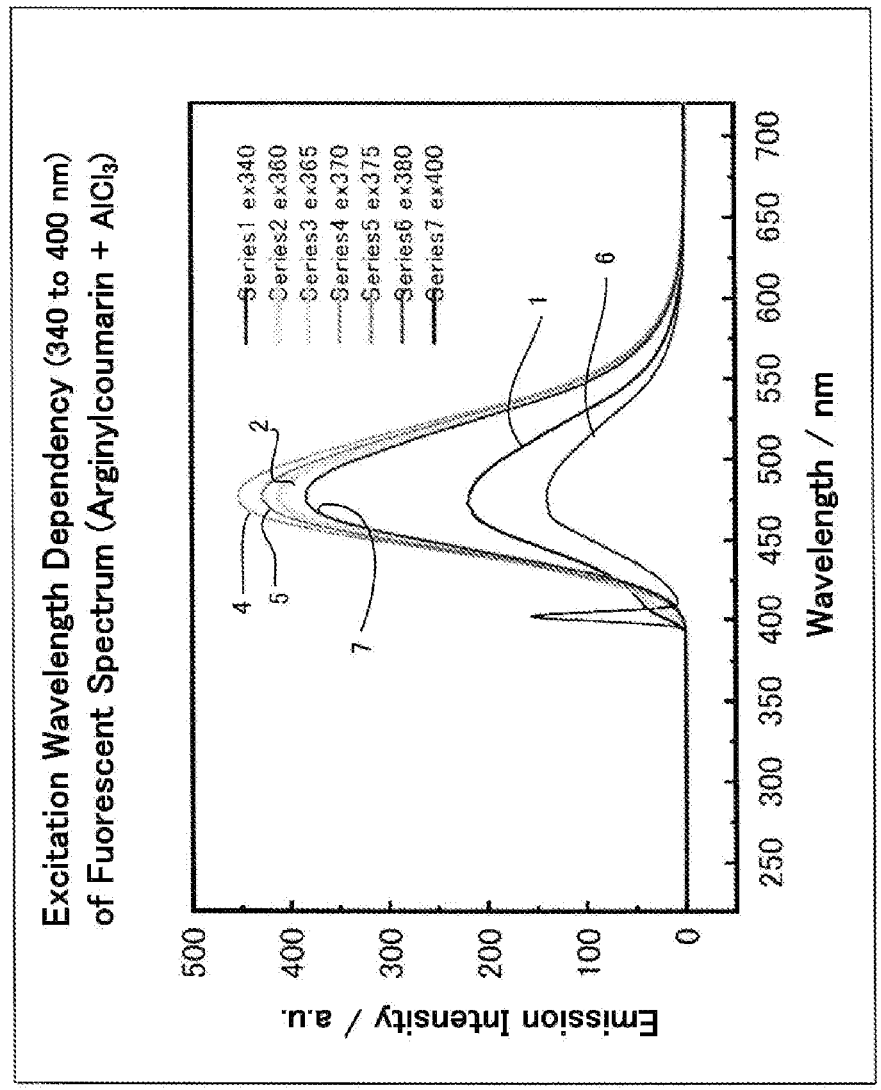
FIG. 17 is a graph showing excitation wavelength dependency (340 to 400 nm) of a fluorescent spectrum (arginylcoumarin+$AlCl_3$).
Figure 18:
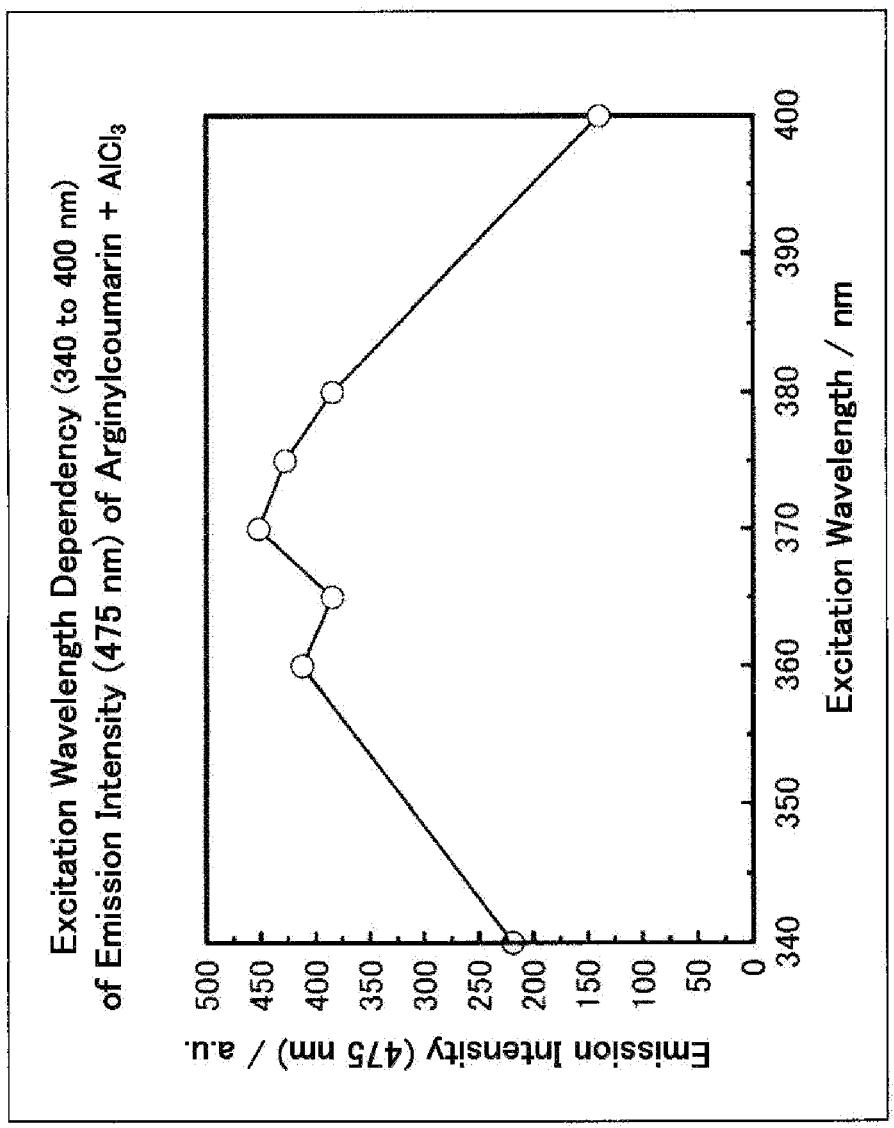
FIG. 18 is a graph showing excitation wavelength dependency (340 to 400 nm) of the emission intensity (475 nm) of arginylcoumarin.

FIG. 17 shows the emission intensity obtained by irradiating the aqueous solution of the complex of arginylcoumarin and AlCl₃ with light of 340 nm to 400 nm to excite the complex. All the series exhibited emission with an emission peak at 475 nm. Additionally, FIG. 18 shows an excitation spectrum in which the emission intensity at 475 nm is plotted against the excitation wavelength of 340 nm to 400 nm which causes the excitation. This spectrum shows that the emission intensity (emission intensity at 475 nm) is largest with excitation at 370 nm.

Summarizing the above results, the above complex of arginylcoumarin and AlCl₃ emits internal light having an emission maximum at 363 nm by being excited by external light of 280 nm. This internal light excites the complex, and this excited complex emits visible light having an emission maximum at 475 nm. At this time, the complex exhibits the largest emission intensity of visible light when the excitation wavelength is 370 nm, as shown in FIG. 18. Namely, the closer the excitation wavelength is to 370 nm, the stronger the emission of visible light is; in other words, ultraviolet light can be converted into visible light efficiently. The above complex of arginylcoumarin and AlCl₃ emits internal light having an emission maximum at 363 nm. This is close to 370 nm mentioned above. It can be seen that ultraviolet light was therefore efficiently converted into visible light and that very intense light of 475 nm in a color of light blue was obtained.

Figure 19:
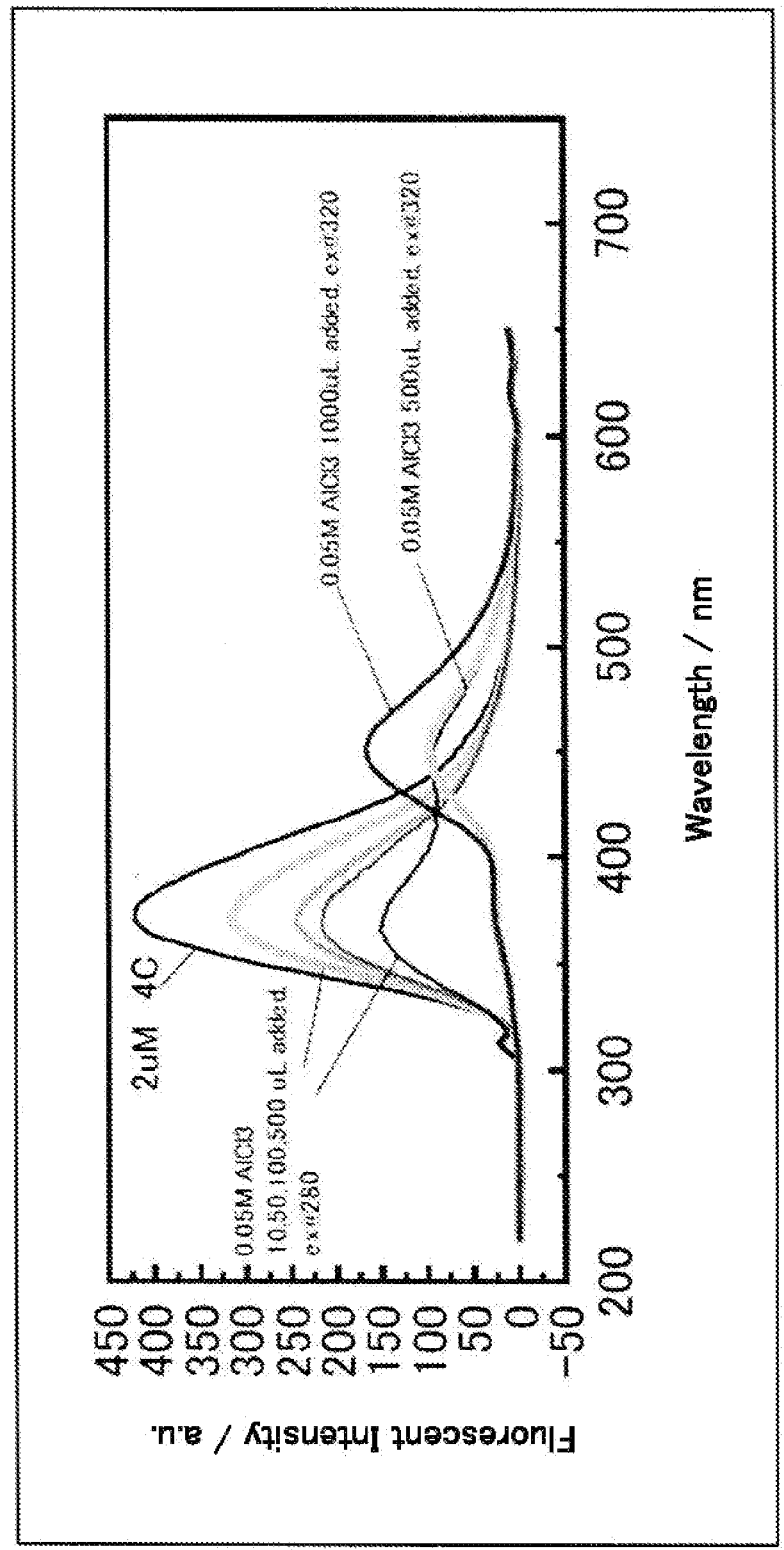
FIG. 19 is a graph showing an emission spectrum in a case of adding $AlCl_3$ to 4-hydroxycoumarin.

FIG. 19 shows an emission spectrum obtained in the case of adding AlCl₃ to 4C. In this case, the complex (4C-AlCl₃ complex) emits internal light having an emission maximum at 363 nm by being irradiated with light of 280 nm. However, in the second excitation step, this complex exhibits the largest emission of visible light (450 nm) when the excitation wavelength is 320 nm. Therefore, the internal light (363 nm) emitted cannot be used fully in the second excitation step, preventing efficient conversion of ultraviolet light into visible light. In consequence, strong emission of light cannot be obtained.

From above, in the present invention, an emission peak wavelength $\lambda_1$ (nm) of the internal light emitted in the internal light emission step and an excitation wavelength $\lambda_2$ (nm) at which an emission peak of the visible light is obtained when the fluorescent material excited in the second excitation step emits the visible light, preferably have the relation, $\lambda_1$="$\lambda_2$−22" to "$\lambda_2$+22".

Further, since ultraviolet light can be converted into visible light efficiently and strong emission of visible light can be obtained when $\lambda_1$ and $\lambda_2$ are closer to each other, $\lambda_1$="$\lambda_2$−15" to "$\lambda_2$+15" is more preferred, and $\lambda_1$="$\lambda_2$−10" to "$\lambda_2$+10" is even more preferred.

(Addition of a Low Molecular Weight Alcohol)

The ultraviolet-light-shielding and visible-light-increasing material of the present invention preferably further comprises a low molecular weight alcohol. This enables further enhancement of the emission efficiency of visible light. The specific mechanism is unknown, but it is assumed that the low molecular weight alcohol gives some influence to the coordination geometry of the complex of arginylcoumarin and AlCl₃. 2-propanol is preferred as the low molecular weight alcohol to be contained.

<Emission Under High Concentration Condition>

The above example data observed in the case of adding AlCl₃ to 4was based on a low-concentration condition in an aqueous solvent. Herein, the case example examined in a high-concentration condition will be explained. In this case, 4C is prepared in solid powder form. First, 4C dissolved in a low molecular weight alcohol solvent such as 2-propanol, which dissolves a relatively large amount of 4C, until the solution gets saturated. For example, in the case of 2-propanol, 4C is dissolved up to about 20 mg per 1 mL. Thereafter, AlCl₃ is dissolved until the solution gets saturated. Water can dissolve a large amount of AlCl₃, for example 1 g or more per 1 mL. However, as to 2-propanol, when about 10 mg of AlCl₃ is dissolved therein, the solution gets saturated. This mixed solution is extremely highly concentrated, and therefore the emission spectrum thereof cannot be measured directly by a fluorescence spectrophotometer. However, with irradiation of light of 365 nm or 375 nm from a light source such as an ultraviolet lamp, strong emission of light in a color of blue to light blue can be observed by the naked eye.

Likewise, arginylcoumarin is prepared in solid powder form and dissolved in a solvent until the solution gets saturated. Arginylcoumarin has high solubility both in water and in alcohol. For example, arginylcoumarin is dissolved in water, in an amount up to about 20 mg. Thereafter, 10 mg of AlCl₃ is dissolved therein to obtain a mixed solution in high concentration. In this case as well, the emission spectrum of this mixed solution cannot be measured directly by a fluorescence spectrophotometer. However, with irradiation of light of 365 nm or 375 nm from a light source such as an ultraviolet lamp, strong emission of light in a color of light blue to green can be observed by the naked eye.

The reason why the color of light emitted by 4C and $AlCl_3$ in the high-concentration condition is blue to light blue, and the color of light emitted by arginylcoumarin and $AlCl_3$ in the high-concentration condition on the other hand is light blue to green, is because the emission maximum wavelength thereof in the low-concentration condition is different from each other as in 450 nm and 475 nm, and at the same time because of the effect that the overall increase of the emission intensity in the visible region (400 nm to 600 nm) causes increase in the emission amount of light of a longer wavelength, thereby making the light look in a color of a wavelength slightly longer than the color of the emission maximum wavelength.

Summarizing the above case example, the complex (4C-$AlCl_3$ complex) emits internal light having an emission maximum at 363 nm by being irradiated with light of 280 nm in the first excitation step; the complex emits visible light at maximum (450 nm) when the excitation wavelength is 320 nm in the second excitation step; and therefore the internal light (363 nm) emitted cannot be fully used in the second excitation step. Even so, when a low molecular weight alcohol such as 2-propanol is used as a solvent, the solubility of 4C increases, and as a result of the increase in the concentration, strong emission of light can be obtained. In this case, the addition amount of $AlCl_3$ is limited since the solubility of $AlCl_3$ in the low molecular weight alcohol is smaller compared to the case of using water as a solvent. However, it has an advantage that decrease in visible light transmission due to addition of $AlCl_3$ can be inhibited. In consideration of a balance between such increase in costs and increase in the advantageous effects, It is possible to provide an advantageous effect of obtaining a transparent visible-light-emitting material in the form of a low molecular weight alcohol solution containing large amount of 4C.

<Visible Light Transmission>

Figure 6:
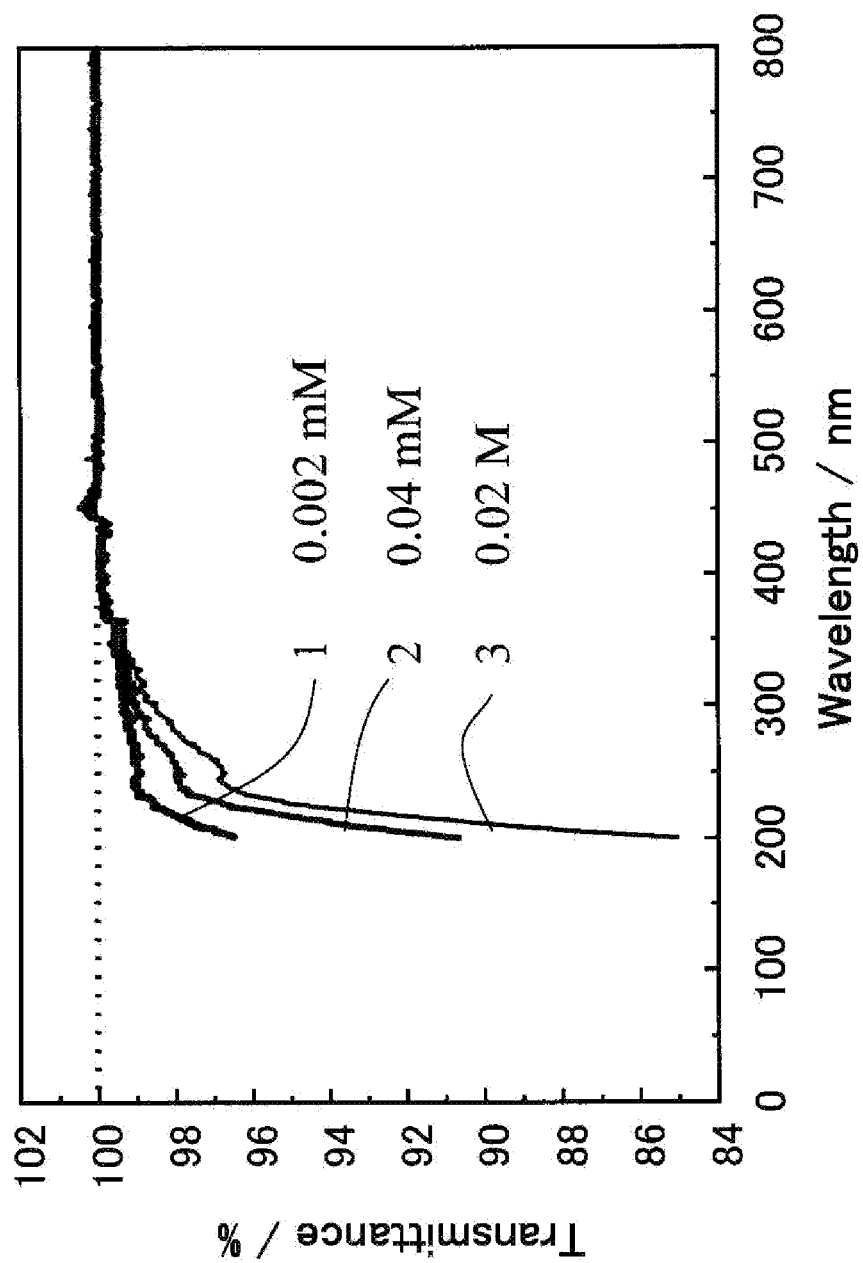
FIG. 6 is a light transmission spectrum of arginylcoumarin.

FIG. 6 shows wavelength dependency of transmission in the ultraviolet light to visible light region by arginylcoumarin (Arg-C) for each different concentration. The line 1 shows a measurement result of a case of concentration 0.002 mM. The line 2 shows a measurement result of a case of 0.04 mM. The line 3 shows a measurement result of a case of 0.02 mM. It can be understood that in all of the concentration cases, arginylcoumarin (Arg-C) is transparent to the visible light region of 400 nm or more. In the ultraviolet light region, the transmission decreases since there is absorption in the region of 330 nm or less with increase in the concentration.

Figure 7:
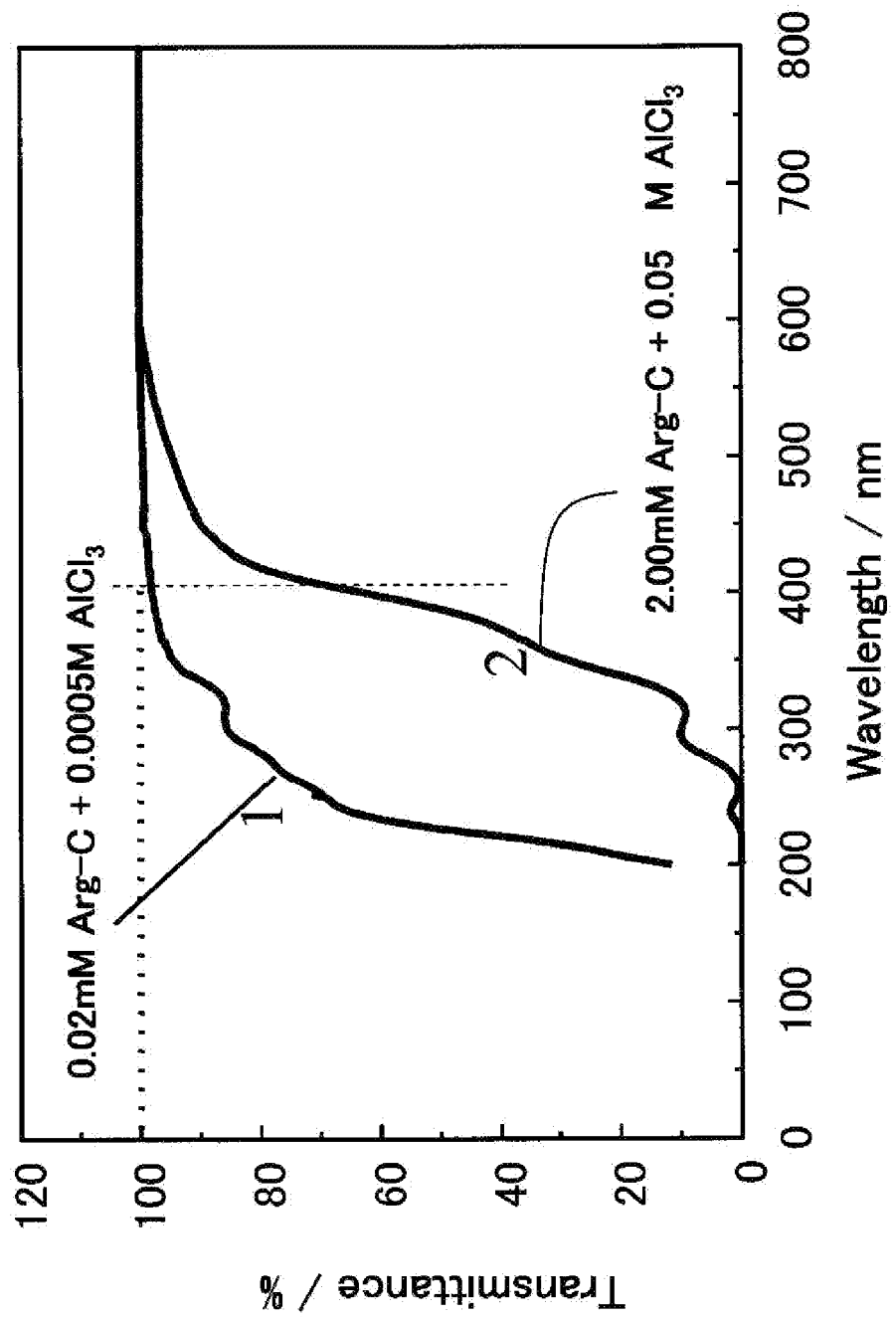
FIG. 7 is a light transmission spectrum of a mixed solution of arginylcoumarin and $AlCl_3$.

FIG. 7 shows wavelength dependency of transmission in the ultraviolet light to visible light region by Arg-C+$AlCl_3$, for each different concentration. The line 1 shows a measurement result of a case of Arg-C in 0.02 mM and $AlCl_3$ in 0.0005 M. It can be understood that in such a low-concentration case as this, 100% transparency is obtained in the visible light region of 400 nm or more. The line 2 shows a measurement result of a case of Arg-C in 2.00 mM and $AlCl_3$ in 0.05M, which is an extremely high concentration being 100 times more than in the above case. In this case as well, the transmission in the visible light region is high, as in approximately 70% transmission in a wavelength of 400 nm, approximately 90% transmission in a wavelength of 450 nm, and approximately 95% in a wavelength of 500 nm.

Ideal transmission of visible light would be that with a boundary at a wavelength of 400 nm, the transmission on a shorter wavelength side is 0%, and the transmission on a longer wavelength side is 100%. However, in reality there are no materials which have such a characteristic and which can also convert ultraviolet absorption energy into visible light. Comparing the materials that actually exist, the wavelength dependency of the transmission by Arg-C+$AlCl_3$ in the ultraviolet light to the visible light region shown in FIG. 7 can be evaluated as being closest to meeting required conditions. The reason is that polarization is made such that with the boundary at a wavelength of 400 nm, the transmission on the shorter wavelength side is lower and the transmission on the longer wavelength side is higher.

<Layered Material>

The method of shielding ultraviolet light and increasing visible light of the present invention may be implemented by a combination of two fluorescent materials, in such a manner as making a fluorescent material perform the first excitation step and the internal light emission step, and making a different fluorescent material perform the second excitation step and the visible light emission step. These two fluorescent materials can be formed into a layered material so that the layered material comprises: a first layer constituted by a fluorescent material A that performs the first excitation step and the internal light emission step; and a second layer constituted by a fluorescent material B that performs the second excitation step and the visible light emission step. Such a layered material can be formed by preparing a glass sheet having two layers of space inside the glass and filling the two layers of space with the fluorescent material A and the fluorescent material B, respectively. It is preferable to dispose this layered material in a manner that the first layer formed of the fluorescent material A is positioned on a side where external light enters, and that the second layer formed of the fluorescent B is positioned on a side where visible light is utilized, for example on an indoor side.

It is preferable to make the above layered material by using 4-hydroxycoumarin as the fluorescent material A to form the first layer, and using 7-hydroxy-4-methylcoumarin as the fluorescent material B to form the second layer. In this case, 4-hydroxycoumarin gets excited by external light of 200 to 300 nm to emit internal light having an emission maximum at 374 nm. Then, 7-hydroxy-4-methylcoumarin gets excited by this internal light and by external light of 330 to 400 nm to emit visible light having an emission maximum at 450 nm.

Figure 13:
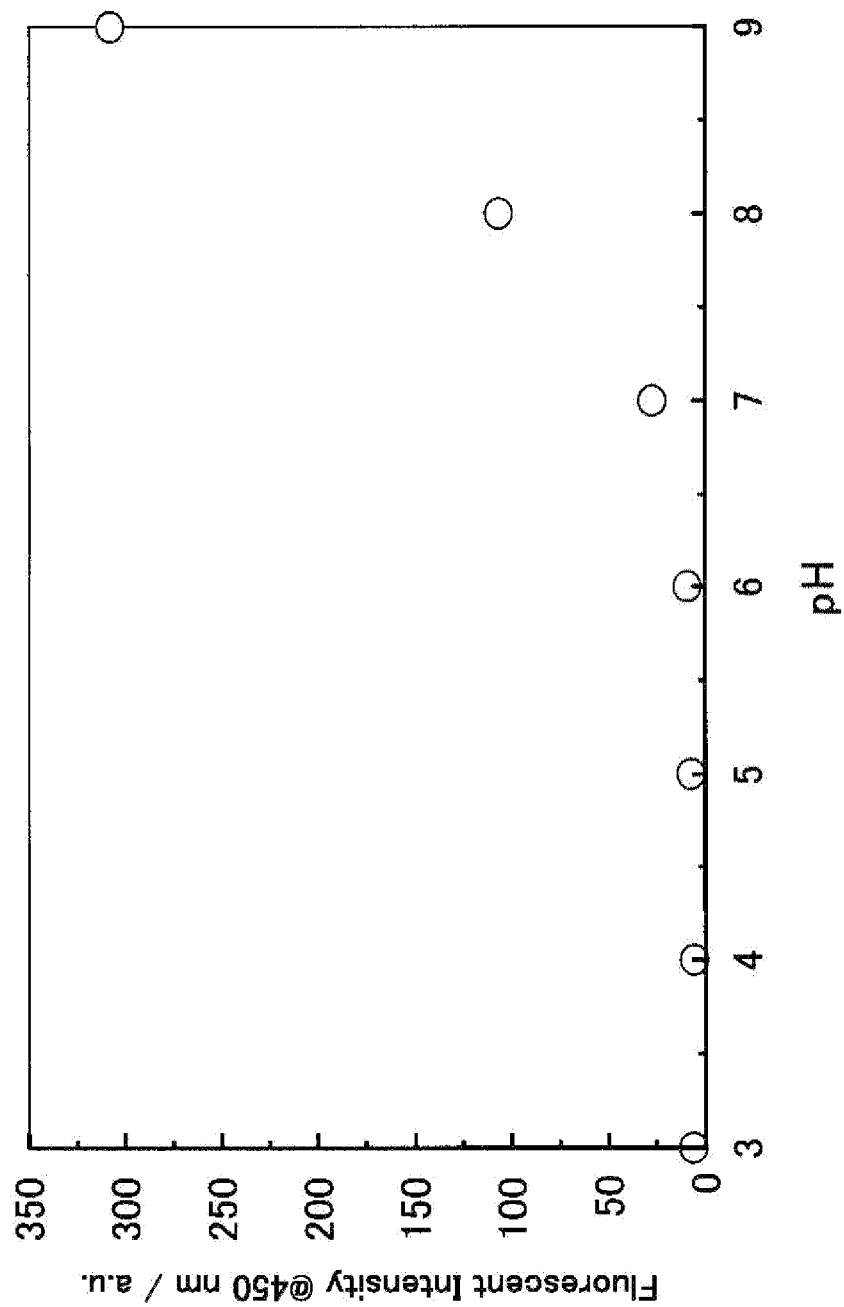
FIG. 13 shows pH dependency of fluorescent intensity at a wavelength of 450 nm in the case of exciting the 7-hydroxy-4-methylcoumarin aqueous solution by the light of 360 nm.

In the above combination, it is preferable for the second layer containing 7-hydroxy-4-methylcoumarin to have a pH of 7 or more. As shown in FIG. 10, the excitation peak wavelength of 7-hydroxy-4-methylcoumarin varies depending on its pH value. When its pH is less than 7, the excitation peak wavelength is 320 nm. When its pH is 7 or more, the excitation peak wavelength is 360 nm. As mentioned above, the emission peak wavelength of the internal light emitted from the first layer is 374 nm. Therefore, the closer this emission peak wavelength and the excitation peak wavelength are to each other, the more efficiently it is possible to convert ultraviolet light into visible light. Accordingly, it is preferable for the second layer containing 7-hydroxy-4-methylcoumarin to have a pH of 7 or more, by which the excitation peak wavelength becomes 360 nm. Further, as shown in FIG. 13, the higher the pH is, the larger the emission intensity at 450 nm becomes. Based on this, the pH of the second layer is more preferably 8 or more, and still more preferably 9 or more.

Additionally, it is preferable to make the above layered material by using 4-hydroxycoumarin as the fluorescent material A to form the first layer, and using a complex of arginylcoumarin and $AlCl_3$ as the fluorescent material B to form the second layer. In this layered body, the function of the first layer is the same as that described above. In the second layer, the complex of arginylcoumarin and $AlCl_3$ has an excitation peak wavelength of 370 nm, and emits visible light of 475 nm. Since the excitation peak wavelength is close to the peak wavelength 374 nm of the internal light emitted from the first layer, it is possible to covert ultraviolet light into visible light efficiently. Moreover, adding a low molecular weight alcohol to the complex of arginylcoumarin and $AlCl_3$ of the second layer enables further enhancement of the emission efficiency.

The ultraviolet-light-shielding and visible-light-increasing material, and the layered material which can realize the ultraviolet-light-shielding and visible-light-increasing material of the present invention described above, is basically in a configuration that a solution having a fluorescent material dissolved and having water or a low molecular weight alcohol as a solvent (or a mixed solution thereof) is encapsulated in a glass container. In this case, the liquid flows in the glass container in convection, therefore producing natural fluctuation in the emission of the blue or light blue-colored light and bringing healing effects to a person inside. As the glass container, a sheet-shaped glass having a thin space thereinside (in a configuration like an insulated glass having an air layer thereinside) may be used. With a solution having a fluorescent material dissolved put into the space, the glass can be used as a window glass. Additionally, glass objects in various configurations having a space thereinside may also be used as the glass container. By putting a solution having a fluorescent material dissolved into the space and putting the glass object in the sunlight (or irradiated with ultraviolet light of 360 nm to 375 nm by an LED light source or the like), it is possible to enjoy the emission of the blue light or light blue-colored light.

However, if the glass container breaks, there is a risk of the aqueous solution thereinside spilling out. In order to prevent this, the aqueous solution containing a fluorescent material may be made into a gel form or a resin form, to be encapsulated in the glass container. Further, depending on the purpose of use, the fluorescent material according to the present invention may be added to a gelatinous composition such as agarose to make a gel form; or the fluorescent material according to the present invention may be dispersed in a resin to make a resin form. These may be used directly in the shape of a sheet, a film, etc.

In the case of making a gel form, specifically the following may be used: a polysaccharides such as agarose, D-galactose, 3,6-anhydrogalactose, and D-mannose; and monosaccharides such as D-glucose, dextrose, glucose, cartose, glucolin, grape sugar, corn sugar, cerelose, fructose, laevosan, laevoral, levugen, levulose, and fruit sugar. Cellulose and other biological components are not particularly limited. However, especially when high strength is needed, cellulose produced by bacteria such as acetic acid bacteria, gellan gum, etc. are preferably employed.

Additionally, in the case of dispersing, in a resin, the fluorescent material according to the present invention, a transparent polymer resin material may be specifically employed which is made of a substance such as epoxy resin, polystyrene, polyethylene, polyethylene terephthalate, polypropylene, poly (methyl methacrylate), poly(ethyl methacrylate), poly(butyl methacrylate), polycarbonate, polyvinyl alcohol, ethylene vinyl acetate, urethane, cellulose acetate, cellulose acetate butyrate, cellulose acetate propionate, ethylene ethyl acrylate, ethylene-vinyl acetate copolymner, ethylene-vinylalcohol copolymer, isophorone diisocyanate, diphenylmethane diisocyanate, acrylonitrile butadiene styrene, methyl methacrylate butadiene styrene copolymer, polyacrylic acid, polyester alkyd resin, polyacrylonitrile, polyvinyl butyral, polyvinyl acetate, and vinyl chloride vinyl acetate.

For example, the fluorescent material according to the present invention is added under the presence of a monomer to constitute a resin; and thereafter the monomer is polymerized. Thereby a resin-form fluorescent material having the fluorescent material dispersed in the resin can be obtained. Alternatively, a resin-form fluorescent material may be obtained by mixing the fluorescent material according to the present invention with a curable resin such as an ultraviolet curable resin and thereafter curing the curable resin. Additionally, after melting a transparent thermoplastic resin, adding the fluorescent material according to the present invention thereto, and mixing them together, the mixture may be subjected to melt extrusion, injection molding, or the like. Thereby, a resin shaped body containing the fluorescent material can be obtained.

Especially, resin materials that can be polymerized at low temperature without necessitating a high temperature condition, such epoxy resins, are suitably employed. This is because it is possible to easily disperse the present material in a resin and solidify it by polymerization through chemical reaction or by light polymerization.

There are art objects or the like configured such that water runs down on a glass sheet; so a solution containing the fluorescent material according to the present invention may be used as the running water. In this case, the solution as a fluid itself emits blue or light blue-colored light, and the light emitting medium itself moves; therefore dynamic changes in light emission can be enjoyed.

EXAMPLES

Hereinafter, the present invention will be explained in detail based on Examples and Reference Examples.

Figure 20:
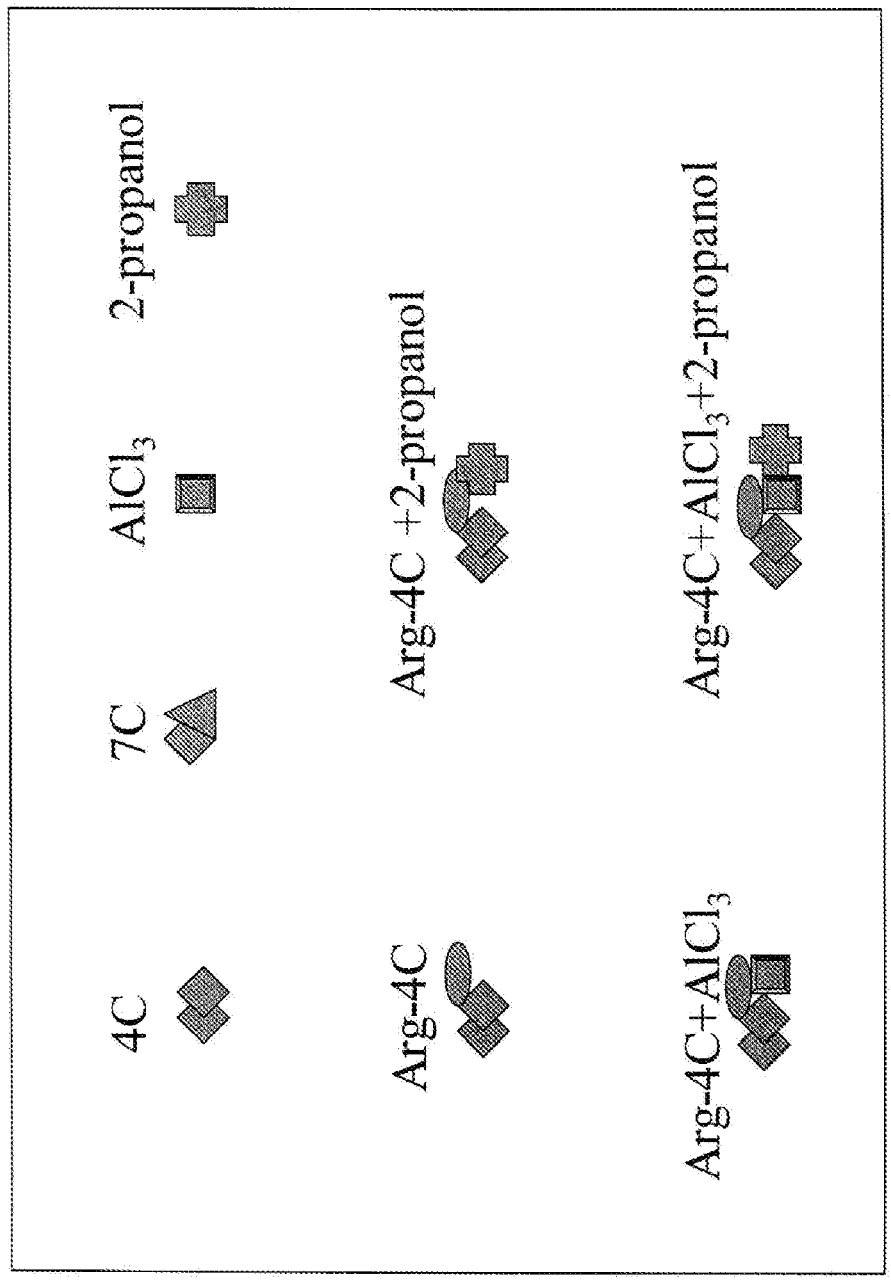
FIG. 20 shows abbreviations of the materials used in Examples.

FIG. 20 gives simplified symbols for the materials used, which are 4-hydroxycoumarin (4C); 7-hydroxy-4-methylcoumarin (7C); aluminum chloride ($AlCl_3$); 2-propanpl; arginylcoumarin (Arg-4C); arginylcoumarin+2-propanol (Arg-4C+2-propanol); arginylcoumarin+aluminum chloride (Arg-4C+$AlCl_3$); arginylcoumarin+aluminum chloride+2-propanol (Arg-4C+$AlCl_3$+2-propanol). In FIGS. 21 to 26, each material is indicated in its simplified symbol.

Example 1

A sample solution was prepared by diluting 5 μL of 0.2 mM arginylcoumarin solution and 10 μL of 0.5 M $AlCl_3$ solution, with distilled water so that the total amount of the sample solution was 3000 μl. This sample solution was filled in a self-made sample cell formed of two quartz plates (each having a size of 20 mm×10 mm×1 mm) and a spacer (thickness 3 mm) made of an acrylic resin.

Figure 21:
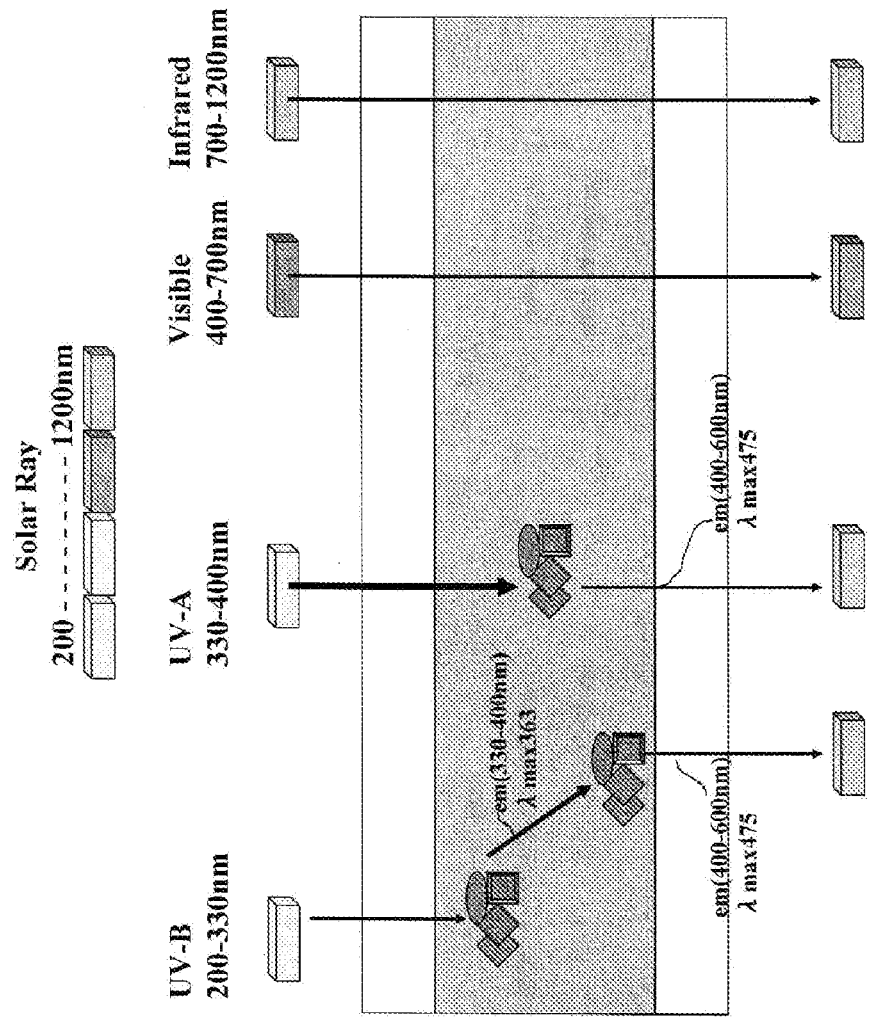
FIG. 21 shows a manner in which ultraviolet light is shielded and visible light is increased by "arginylcoumarin+$AlCl_3$", which is an example of a single material used in Example 1.

FIG. 21 shows a manner in which "arginylcoumarin+$AlCl_3$" of Example 1 shields ultraviolet light and increases visible light. The "arginylcoumarin+$AlCl_3$" gets excited by external light UV-B; and the "arginylcoumarin+$AlCl_3$" thus excited emits internal light of 330 to 400 nm having an emission peak wavelength ($\lambda_{max}$) of 363 nm. Further, the "arginylcoumarin+$AlCl_3$" absorbs this internal light of 330 nm to 400 nm and gets excited thereby; and light blue-colored light of 400 to 600 nm having an emission peak wavelength ($\lambda_{max}$) of 475 nm can be obtained from the "arginylcoumarin+$AlCl_3$" thus excited.

Additionally, the "arginylcoumarin+$AlCl_3$" gets excited by external light UV-A; and light blue-colored light of 400 to 600 nm having an emission peak ($\lambda_{max}$) at 475 nm is obtained from the "arginylcoumarin+AlCl$_3$" thus excited. Visible light and infrared light are directly transmitted.

Herein, the emission peak wavelength ($\lambda_1$) of the excited "arginylcoumarin+AlCl$_3$" is 363 nm; and the excitation wavelength ($\lambda_2$) at which an emission peak of visible light is obtained when the "arginylcoumarin+AlCl$_3$" emits visible light, is 370 nm. Accordingly, the relation between $\lambda_1$ and $\lambda_2$ is "$\lambda_1 = \lambda_2 - 7$".

Example 2

A sample solution was prepared by diluting 5 μL of 0.2 mM arginylcoumarin solution, 10 μL of 0.5 M AlCl$_3$ solution, and 100 μL of 2-propanol, with distilled water so that the total amount of the sample solution was 3000 μL. This sample solution was filled in the same self-made sample cell as that of Example 1.

Figure 22:
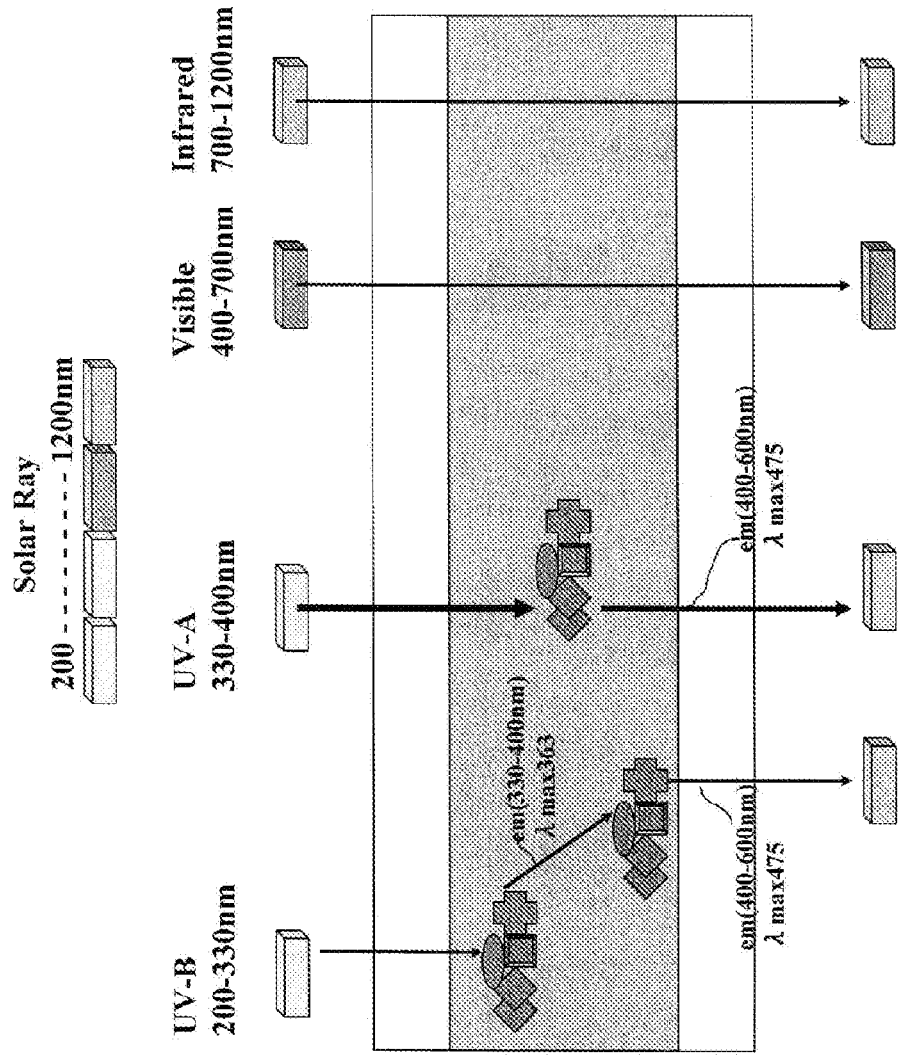
FIG. 22 shows a manner in which ultraviolet light is shielded and visible light is increased by "arginylcoumarin+$AlCl_3$+2-propanol", which is an example of a single material used in Example 2.

FIG. 22 shows a manner in which "arginylcoumarin+AlCl$_3$+2-propanol" of Example 2 shields ultraviolet light and increases visible light. The mechanism by which light blue-colored light is obtained is the same as in Example 1.

Herein, the emission peak wavelength ($\lambda_1$) of the excited "arginylcoumarin+AlCl$_3$+2-propanol" is 363 nm; and the excitation wavelength ($\lambda_2$) at which an emission peak of visible light is obtained when the "arginylcoumarin+AlCl$_3$+2-propanol" emits visible light, is 370 nm. Accordingly, the relation between $\lambda_1$ and $\lambda_2$ is "$\lambda_1 = \lambda_2 - 7$".

In below Examples and Reference Examples, the preparation conditions of the sample was set such that: the concentration of arginylcoumarin, 4-hydroxycoumarin, or 7-hydroxy-4-methylcoumarin was 0.2 mM×5/3000=0.33 μM; the concentration of AlCl$_3$ was 1.67 mM; and the concentration of 2-propanol was 3.3 V/V %.

Example 3

A sample solution (first solution) (pH 3) containing 4-hydroxycoumarin (4C) and a sample solution (second solution) (pH 9) containing 7-hydroxy-4-methylcoumarin (7C) were each prepared. Each of the sample solutions was filled in a self-made quartz cell formed of three quartz plates (each having a size of 20 mm×10 mm×1 mm) and two spacers (each having a thickness of 1 mm) made of an acrylic resin. Thereby, a layered material comprising a first layer formed of the first solution and a second layer formed of the second solution was obtained.

Figure 23:
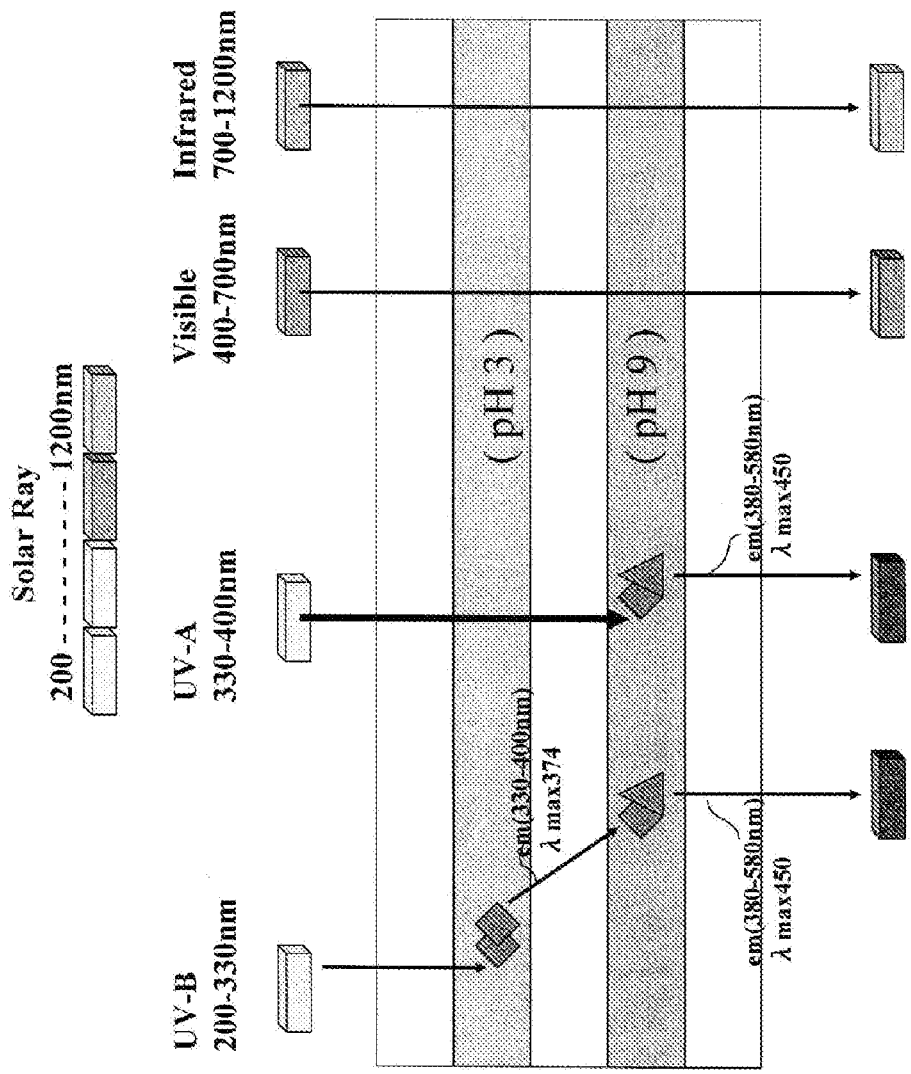
FIG. 23 shows a manner in which ultraviolet light is shielded and visible light is increased by 4C (a first layer) and 7C (a second layer, a pH of 7 or more), which is an example of a layered material used in Example 3.

FIG. 23 shows a manner in which 4C (first layer, pH 3) and 7C (second layer, pH 9) shield ultraviolet light and increase visible light. 4C in the first layer gets excited external light UV-B; and 4C thus excited emits internal light of 330 to 400 nm having an emission peak wavelength ($\lambda_{max}$) of 374 nm. 7C in the second layer absorbs this internal light of 330 nm to 400 nm and gets excited thereby; and blue light of 380 to 580 nm having an emission peak wavelength ($\lambda_{max}$) of 450 nm is obtained from 7C thus excited.

Additionally, 7C gets excited by external light UV-A; and blue light of 380 to 580 nm having an emission peak wavelength ($\lambda_{max}$) of 450 nm is obtained from 7C thus excited. Visible light and infrared light are directly transmitted.

Herein, the emission peak wavelength ($\lambda_1$) of 4C excited is 374 nm; and the excitation wavelength ($\lambda_2$) at which an emission peak of visible light is obtained when 7C emits visible light, is 360 nm. Accordingly, the relation between $\lambda_1$ and $\lambda_2$ is "$\lambda_1 = \lambda_2 + 14$".

Example 4

A sample solution (first solution) (pH 3) containing 4C and a sample solution (second solution) (pH 4.8 to 3.9) containing arginylcoumarin and AlCl$_3$ were each prepared.

Figure 24:
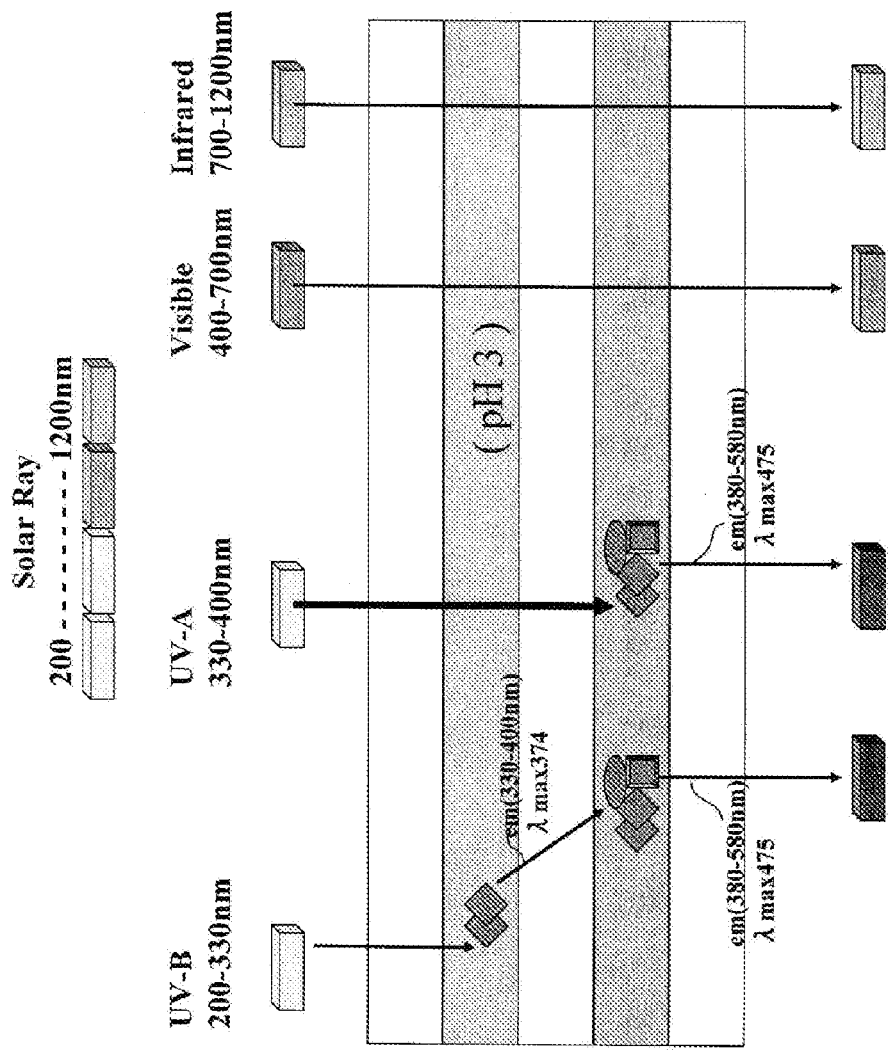
FIG. 24 shows a manner in which ultraviolet light is shielded and visible light is increased by 4C (a first layer) and "arginylcoumarin+$AlCl_3$" (a second layer), which is an example of a layered material used in Example 4.

FIG. 24 shows a manner in which 4C (first layer, pH 3) and "arginylcoumarin+AlCl$_3$" (second layer, pH 4.8 to 3.9) shield ultraviolet light and increase visible light. 4C in the first layer gets excited external light UV-B; and 4C thus excited emits internal light of 330 to 400 nm having an emission peak wavelength ($\lambda_{max}$) of 374 nm. Further, the "arginylcoumarin+AlCl$_3$" in the second layer absorbs this internal light of 330 to 400 nm and gets excited thereby; and light blue-colored light of 380 to 580 nm having an emission peak wavelength ($\lambda_{max}$) of 475 nm is obtained from the "arginylcoumarin and AlCl$_3$" thus excited.

Additionally, the "arginylcoumarin+AlCl$_3$" gets excited by external light UV-A; and light blue-colored light of 380 to 580 nm having an emission peak wavelength ($\lambda_{max}$) of 475 nm is obtained from the "arginylcoumarin+AlCl$_3$" thus excited. Visible light and infrared light are directly transmitted.

Herein, the emission peak wavelength ($\lambda_1$) of 4C excited is 374 nm; and the excitation wavelength ($\lambda_2$) at which an emission peak of visible light is obtained when the "arginylcoumarin+AlCl$_3$" emits visible light, is 370 nm. Accordingly, the relation between $\lambda_1$ and $\lambda_2$ is "$\lambda_1 = \lambda_2 + 4$".

Example 5

A sample solution (first solution) (pH 3) containing 4C and a sample solution (second solution) (pH 4.8 to 3.9) containing "arginylcoumarin+AlCl$_3$+2-propanol" were each prepared.

Figure 25:
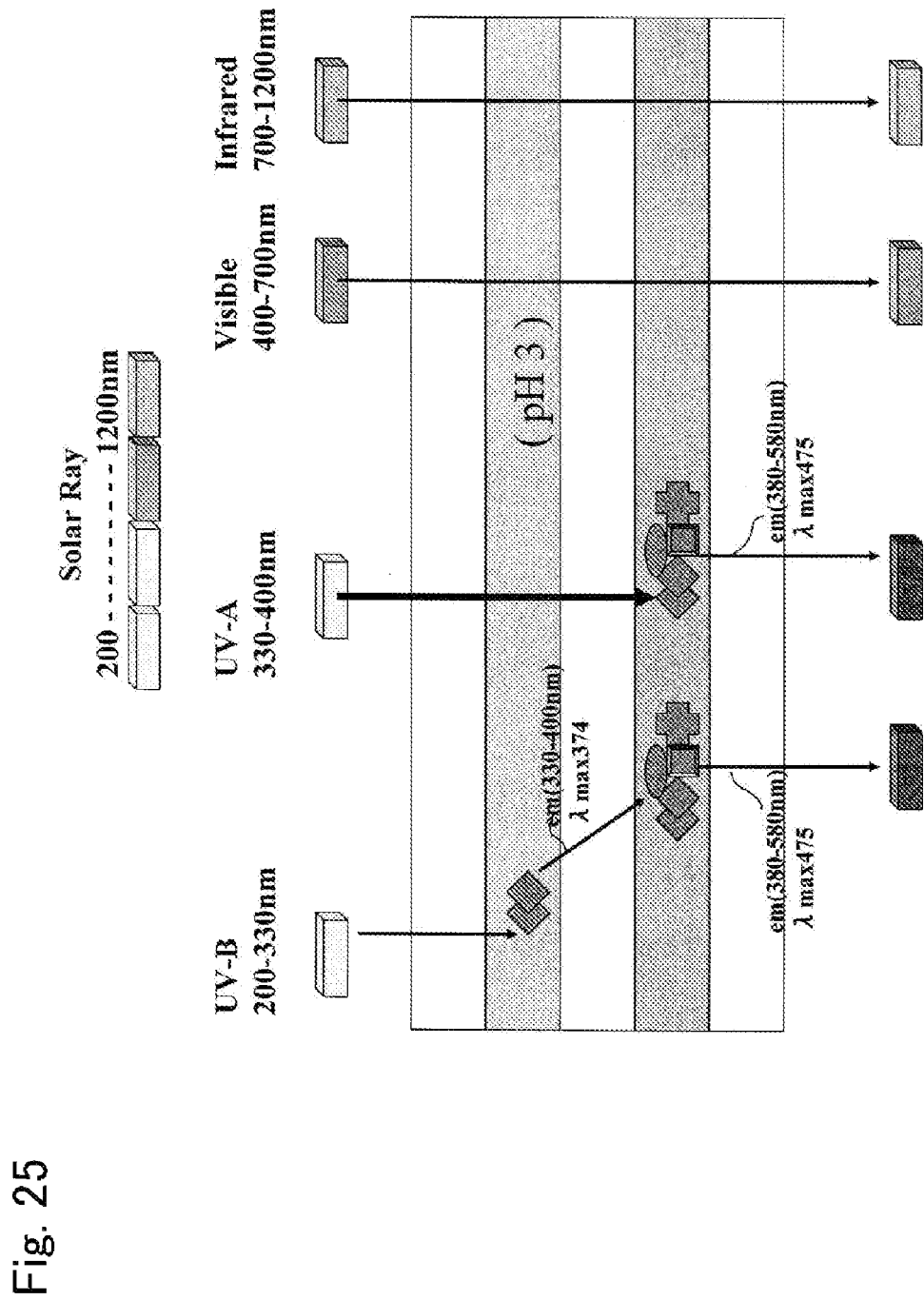
FIG. 25 shows a manner in which ultraviolet light is shielded and visible light is increased by 4C (a first layer) and "arginylcoumarin+AlCl$_3$+2-propanol" (a second layer), which is an example of a layered material used in Example 5.

FIG. 25 shows a manner in which 4C (first layer) and "arginylcoumarin+AlCl$_3$+2-propanol" (second layer) shield ultraviolet light and increase visible light. The mechanism by which light blue-colored light is obtained is the same as in Example 4.

Herein, the emission peak wavelength ($\lambda_1$) of 4C excited is 374 nm; and the excitation wavelength ($\lambda_2$) at which an emission peak of visible light is obtained when the "arginylcoumarin+AlCl$_3$+2-propanol" emits visible light, is 370 nm. Accordingly, the relation between $\lambda_1$ and $\lambda_2$ is "$\lambda_1 = \lambda_2 + 4$".

Example 6

A sample solution (first solution) (pH 7.4) containing arginylcoumarin, and a sample solution (second solution) (pH 4.8 to 3.9) containing "arginylcoumarin+AlCl$_3$" were each prepared.

Figure 26:
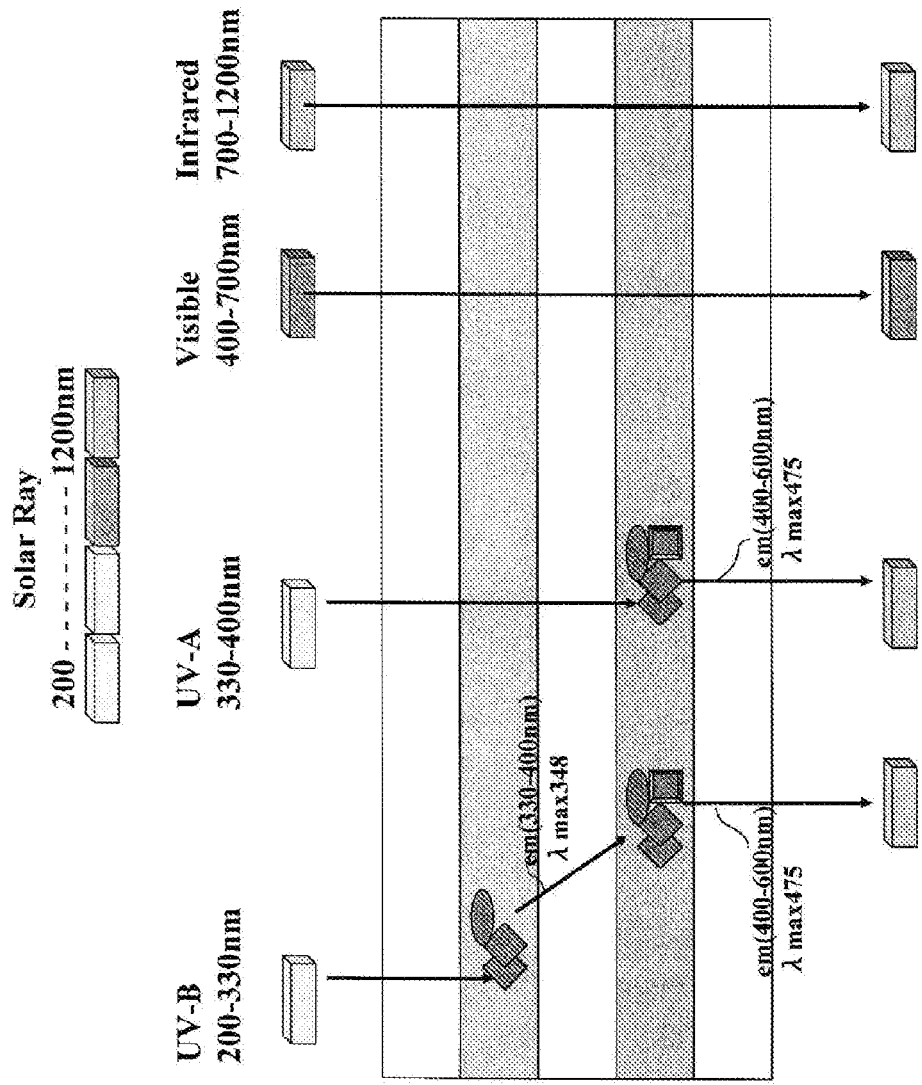
FIG. 26 shows a manner in which ultraviolet light is shielded and visible light is increased by arginylcoumarin (a first layer) and "arginylcoumarin+AlCl$_3$" (a second layer), which is an example of a layered material used in Example 6.

FIG. 26 shows a manner in which arginylcoumarin (first layer, pH 7.4) and "arginylcoumarin+AlCl$_3$" (second layer, pH 4.8 to 3.9) shield ultraviolet light and increase visible light. The arginylcoumarin in the first layer gets excited by external light UV-B; and the arginylcoumarin thus excited emits internal light of 330 to 400 nm, having an emission peak wavelength ($\lambda_{max}$) of 348 nm. The "arginylcoumarin+AlCl$_3$" in the second layer absorbs this internal light of 330 nm to 400 nm and gets excited thereby; and light blue-colored light of 400 to 600 nm having an emission peak wavelength ($\lambda_{max}$) of 475 nm is obtained from the "arginylcoumarin+AlCl$_3$" thus excited.

Additionally, the "arginylcoumarin+AlCl$_3$" gets excited by external light UV-A; and light blue-colored light of 400 to 600 nm having an emission peak wavelength ($\lambda_{max}$) of 475 nm is obtained from the "arginylcoumarin+AlCl$_3$" thus excited. Visible light and infrared light are directly transmitted.

Herein, the emission peak wavelength ($\lambda_1$) of the excited arginylcoumarin is 348 nm; and the excitation wavelength ($\lambda_2$) at which an emission peak of visible light is obtained when the "arginylcoumarin+AlCl$_3$" emits visible light, is 370 nm. Accordingly, the relation between $\lambda_1$ and $\lambda_2$ is "$\lambda_1=\lambda_2-22$".

Reference Example 1

A sample solution containing only 4-hydroxycoumarin (4C) was prepared, and was filled in the same sample cell as that of Example 1.

Herein, the emission peak wavelength ($\lambda_1$) of the excited 4C is 374 nm; and the excitation wavelength ($\lambda_2$) at which an emission peak is obtained when 4C emits visible light, is 300 nm. Accordingly, the relation between $\lambda_1$ and $\lambda_2$ is "$\lambda_1=\lambda_2+74$".

Reference Example 2

A sample solution containing only arginylcoumarin was prepared, and was filled in the same sample cell as that of Example 1.

Herein, the emission peak wavelength ($\lambda_1$) of the excited arginylcoumarin is 348 nm; and the excitation wavelength ($\lambda_2$) at which an emission peak is obtained when the arginylcoumarin emits visible light, is 325 nm. Accordingly, the relation between $\lambda_1$ and $\lambda_2$ is "$\lambda_1=\lambda_2+23$".

Reference Example 3

A sample solution (first solution) (pH 3.0) containing only 4C, and a sample solution (second solution) (pH less than 7) containing only 7C were each prepared; and were filled in the same sample cell as that of Example 3.

Herein, the emission peak wavelength ($\lambda_1$) of the excited 4C is 374 nm; and the excitation wavelength ($\lambda_2$) at which an emission peak of visible light is obtained when 7C emits visible light, is 320 nm. Accordingly, the relation between $\lambda_1$ and $\lambda_2$ is "$\lambda_1=\lambda_2+54$".

The sample cells filled with each sample solution made in Examples and Comparative Examples above, respectively, were put in a sample chamber of fluorescence spectrophotometer FP-750 manufactured by JASCO Corporation (in the case of the layered material, the cell being the first layer was disposed on a side where an excitation light enters). The cells were excited by UV-A ultraviolet light having a wavelength of 370 nm; and the emission intensity at a wavelength of 475 nm was measured.

Figure 27:
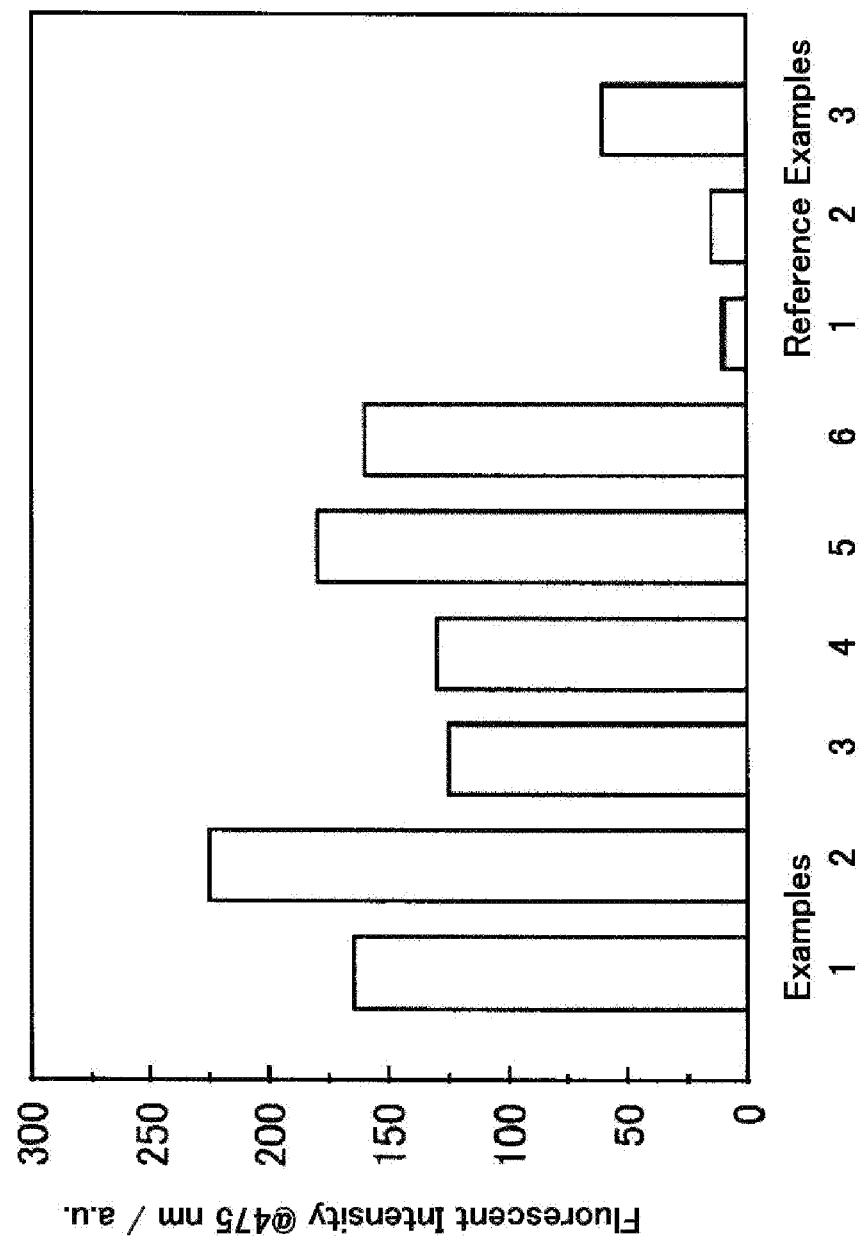
FIG. 27 is a comparison view of experimental results of visible light increase in Examples 1 to 6 and Reference Examples 1 to 3.

The results are shown in FIG. 27. It was confirmed that in Reference Example 1, in which only 4C was used, and in Reference Example 2, in which only arginylcoumarin was used, the emission intensity was low and the visible light emission mechanism was extremely small. Additionally, in Reference Example 3 as well, the visible light emission mechanism was small.

As for the other cases, it was found that in all Examples 1 to 6, the relation, $\lambda_1$="$\lambda_2-22$" to "$\lambda_2+22$" was satisfied by the emission peak wavelength ($\lambda_1$) of the fluorescent material excited and the excitation wavelength ($\lambda_2$) at which an emission peak of visible light was obtained when the fluorescent material emitted visible light, indicating that a strong visible light emission mechanism worked. Especially, in the case of the "arginylcoumarin+AlCl$_3$+2-propanol" as a single material in Example 2, the fluorescent intensity was the highest.

<Advantageous Effects of Adding 2-Propanol>

The reason why 2-propanol contributed to large increase in the emission amount as an additive to arginylcoumarin+AlCl$_3$, was examined in terms of the molecular weight. The above experiment was conducted on several kinds of alcohol molecules, and it was found that when methanol was added, visible light emission disappeared drastically, causing quenching phenomenon. When ethanol or octyl alcohol was added, there were no large changes. Accordingly, it was speculated that the key factor was not the degree of the molecular weight but the molecular interaction, which depends on the molecular structure in the solution. However, a detailed mechanism is unknown. What was found through the observation is that in the case of using 2-propanol, even a small addition thereof brings about an advantageous effect of increasing the emission amount of visible light by 20% or more.

<Solar Cell Power Generation Shielding>

Figure 28:
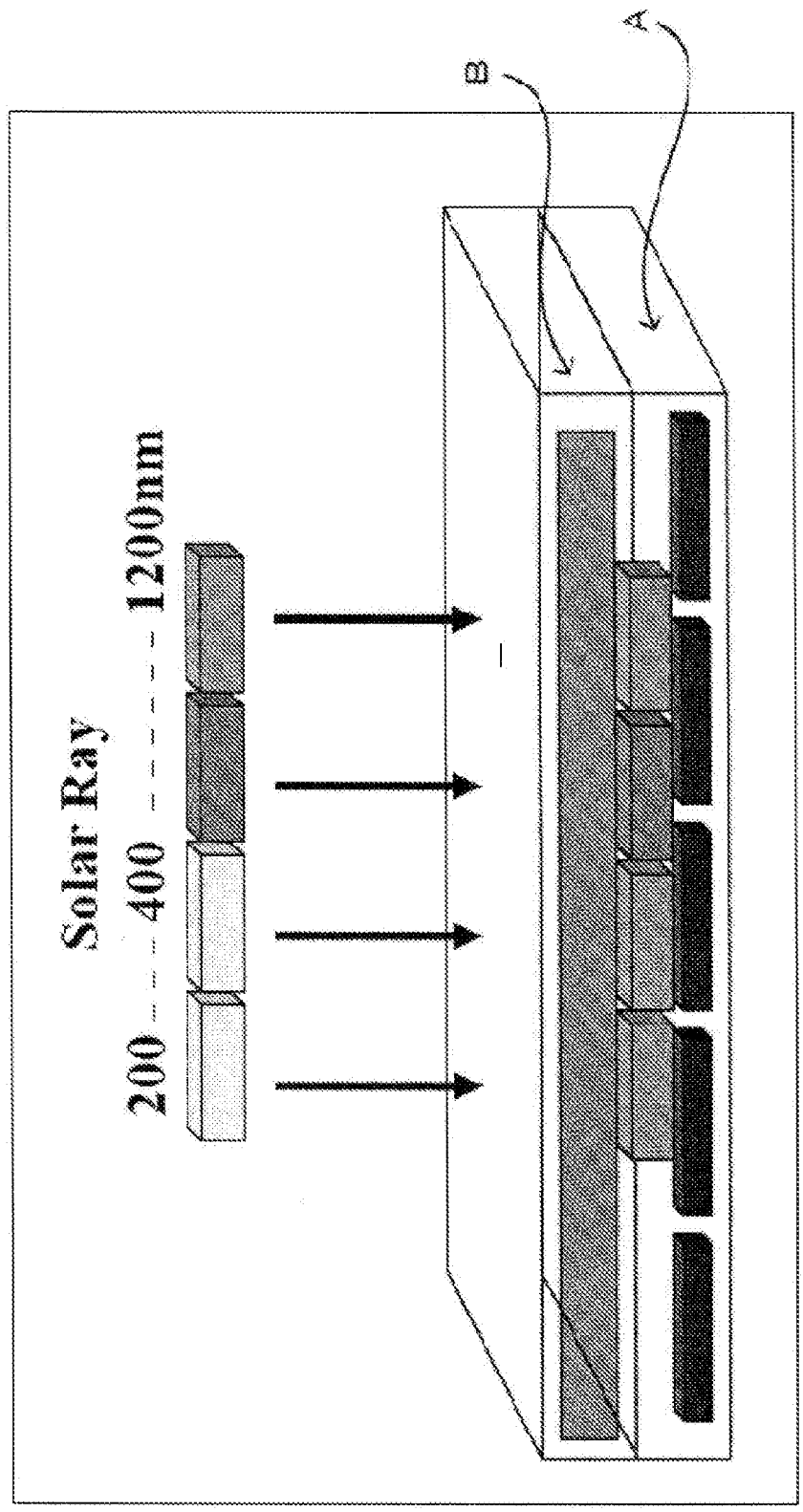
FIG. 28 is a conceptual view of a solar cell module cover.

FIG. 28 is a diagram showing a solar cell module A and a cover B arranged thereon, the cover B encapsulating an aqueous solution containing the ultraviolet-light-shielding and visible-light-increasing material of the present invention, with the aqueous solution sandwiched between glass plates; and showing a manner in which ultraviolet light included in the solar light is converted into visible light to increase visible light to be irradiated to the solar cell.

An experiment was conducted on a case of using arginylcoumarin+AlCl$_3$ as a single material, by the following procedures. A hydrogenated amorphous silicon solar cell (QFSOLAR2510DS) was placed under a glass slide with high transparency in a size of 25 mm×75 mm×thickness 1 mm. A mixed solution "arginylcoumarin+AlCl$_3$" (concentration of arginylcoumarin: 0.1 mM; concentration of AlCl$_3$: 0.25 M) was encapsulated by agarose gel having its edges formed in advance, so that the mixed solution had a thickness of 1 mm and did not leak out; and then was fixated onto the glass slide. Thereby, a test sample 1 was made. Further, a plate simply made of a single glass slide was used as a test sample 2; and a polystyrene plate (25 mm×75 mm×thickness 1 mm) as a polymer material was used as a test sample 3. Moreover, a stacked body of three glass slides was chosen as a test sample 4. An ultraviolet LED which emits ultraviolet light of a wavelength 370 nm was fixed on the upper side of each of the test samples, at the same distance from the solar cell. Then UV-A was irradiated to cause the solar cell to generate power.

Measurement of electric current was carried out three times for each case, and the average value thereof was calculated. Additionally, a relative evaluation value was calculated, based on the value of the case of a single glass slide as the test sample 2. The results are shown in Table 1.

TABLE 1

|  | Data 1 | Data 2 | Data 3 | Average | Relative Evaluation Value |
|---|---|---|---|---|---|
| Test Sample 1 | 23.2 | 23.2 | 21.5 | 22.6667 | 109 |
| Test Sample 2 | 20.9 | 20.8 | 20.5 | 20.7333 | 100 |
| Test Sample 3 | 21.4 | 21.4 | 19.8 | 20.8667 | 101 |
| Test Sample 4 | 19.7 | 19 | 17.9 | 18.8667 | 91 |

From the results shown in Table 1, the power generation was largest in the case of shielding by the "arginylcoumarin+AlCl$_3$" being the test sample 1, with the relative evaluation value of 109.

Even though, in the case of the test sample 1, the shielding effect was twice more than the case of the test sample 2 as a reference, by the thickness of the ultraviolet-light-shielding and visible-light-increasing material, the power generation in the case of the test sample 1 was larger than that in the case of the test sample 2. This confirmed that UV-A light was transmitted in the form of visible light and contributed to the power generation of the solar cell. In this experiment, the amount of power generated was measured with irradiation of relatively weak UV-A, but with irradiation of stronger UV-B light, there would be larger difference.

<Advantageous Effects of a Gelatinous Test Sample>

The following experiment was carried out with the test samples in gel form, instead of the solution form. A 100 g saturated aqueous solution of 4-hydroxycoumarin (4C) was added to 1 g solid powder of agarose mainly composed of polysaccharide; and the resultant was heated, melted, and thereafter cooled, to form a gelatinous solid in a thickness of 1 mm, which was used as a first layer. A 100 g saturated aqueous solution of 7-hydroxy-4-methylcoumarin (7C) was added to 1 g solid powder of gel mainly composed of polysaccharide; and the resultant was heated, melted, and thereafter cooled, to form a gelatinous solid in a thickness of 1 mm, which was used as a second layer. These were stacked to form a layered body, under which a hydrogenated amorphous silicon solar cell (QFSOLAR2510DS) was placed. This was used as a test sample 1. Likewise, a gel was dissolved in distilled water not containing 4C and thereafter cooled to make a gel in a thickness of 1 mm, which was used as a first layer. A gel was dissolved in distilled water not containing 7C and thereafter cooled to make a gel in a thickness of 1 mm, which was used as a second layer. These were stacked to form a layered body, under which a hydrogenated amorphous silicon solar cell (QFSOLAR2510DS) was placed. This was used as a test sample 2. An ultraviolet LED which emits ultraviolet light having a wavelength of 370 nm was fixed on the upper side of each of the test samples, at the same distance from the solar cell. Then UV-A was irradiated to cause the solar cell to generate power. The values of electric current running in each of the cases were compared and evaluated. As a result, with the current value of the case of the test sample 2 as 100, the current value in the case of the test sample 1 was 104. It was clearly shown that the gel form also had an advantageous effect, even though the effect was not as good as in the form of solution.

Any gel may be employed as the gel to be used herein as long as it is a transparent gel composition. A gel composition being transparent and highly durable such as Gellan Gum is more preferred.

<Advantageous Effects of a Resin-Form Test Sample>

Next, the following experimental case of using a test sample in resin form instead of the solution form, will be described. An epoxy resin having high weatherability and a polymerization initiator were prepared as materials. Suitably employed materials are those made of a transparent substance, and starting chemical reaction at room temperature at the same time as being mixed together, to progress polymerization, or progressing polymerization through irradiation of ultraviolet light etc., after being mixed together.

In the experiment, 4C was prepared in a solid powder form, and was dissolved in an amount of 20 mg per 1 mL of 2-propanol. Thereafter, up to 10 mg of $AlCl_3$ was dissolved therein. This mixed solution had extremely high concentration; therefore an emission spectrum thereof could not be measured directly by a fluorescence spectrophotometer. However, irradiation by a light source such as an ultraviolet lamp having a wavelength 365 nm or 375 nm enabled strong emission of light in blue to light blue to be observed by the naked eye. This solution was mixed in an amount of 100 μL with the polymerization initiator; and thereafter 200 μL of epoxy resin liquid was added to be mixed together. Then, the mixture was allowed to stand at room temperature for approximately 120 hours, to complete polymerization. This amount of time to take needs to be adjusted depending on the condition set such as whether the polymerization is carried out by chemical reaction or by light. In any case, the polymerization will be completed certainly.

The resin-form test sample thus obtained was in solid being transparent and having high emission intensity. The emission was so strong that an emission spectrum of the test sample could not be measured directly by a fluorescence spectrophotometer. However, irradiation by a light source such as an ultraviolet lamp having a wavelength 365 nm or 375 nm enabled strong emission of light in light blue to green to be observed by the naked eye.

In polymerizing a resin in the same method as above, a sample was sandwiched by two glass slides at a starting point of the resin polymerization, so that the thickness thereof was 0.5 mm; and thereafter it was solidified by polymerization to make an Example test sample. A hydrogenated amorphous silicon solar cell (QFSOLAR2510DS) was placed under the test sample; and the amount of power generation was measured under the actual sunlight. At this time, a test sample made by mixing in only 2-propanol not containing 4C and $AlCl_3$ was prepared as a reference test sample. A hydrogenated amorphous silicon solar cell of the same specification was placed under the reference test sample; and the amount of power generation was measured under the same condition.

The results are shown in Table 2 below. The electric current (mA) in a case of disposing the test sample and the reference test sample on the solar cell and the electric current (mA) in a case of not disposing them on the solar cell were each measured and given as A (mA) and B (mA), respectively. The measurement was carried out five times; and with the ratio B/A calculated each time, the average value was obtained. When calculation of {(average B/A of Example test sample)/(average B/A of Reference test sample)×100 was made, the value was: (0.9351/0.8722)×100=approximately 107. This experiment was repeated under the sunshine, but it was made clear that the value was in a range of about 106 to 108. The is thought to be caused by variation in the proportion of visible light and infrared light included in the entire energy of the sunlight reaching the ground.

TABLE 2

| | A Electric Current (mA) | B Electric Current (mA) | B/A | Average B/A |
|---|---|---|---|---|
| Example Test Sample | 0.31 | 0.30 | 0.9677 | 0.9351 |
| | 0.31 | 0.29 | 0.9355 | |
| | 0.31 | 0.28 | 0.9032 | |
| | 0.31 | 0.29 | 0.9355 | |
| | 0.30 | 0.38 | 0.9333 | |
| Reference Test Sample | 0.33 | 0.28 | 0.8485 | 0.8722 |
| | 0.32 | 0.29 | 0.9063 | |
| | 0.33 | 0.29 | 0.8788 | |
| | 0.33 | 0.29 | 0.8788 | |
| | 0.33 | 0.28 | 0.8485 | |

The same experiment was carried out using arginylcoumarin instead of 4C; and as a result, it was clearly shown that the calculation of {(average B/A of Example test sample)/(average B/A of Reference test sample)×100 resulted in a range of 107 to 109, which was higher. The reason for this is thought be that the emission maximum of arginylcoumarin was a wavelength longer than that of 4C by 25 nm and that there occurred an effect of wavelength conversion of photons into a wavelength region where the spectral sensitivity of the solar cell was high.

The invention has been described above as to the embodiment which is supposed to be practical as well as preferable at present. However, it should be understood that: the invention is not limited to the embodiment disclosed in the specification and can be appropriately modified within the range that does not depart from the gist or spirit of the invention, which can be read from the appended claims and the overall specification; and that a method of shielding ultraviolet light and increasing visible light, and an ultraviolet-light-shielding and visible-light-increasing material with such modifications are also encompassed within the technical range of the invention.

INDUSTRIAL APPLICABILITY

When the transparent visible light emitting material is used in a resin solid which is used as an encapsulating material in a solar cell module, or in a resin coating which is used for coating a surface of a solar cell, instead of an ultraviolet absorber which is usually contained therein simply for the purpose of preventing deterioration caused by ultraviolet light, not only prevention of such deterioration but also improvement in the amount of power generation can be expected.

Furthermore, the method of shielding ultraviolet light and increasing visible light of the present invention, and the ultraviolet-light-shielding and visible-light-increasing material of the present invention can be adopted for example in the form of a glass plate for buildings, particularly a glass plate used when the inside needs to be bright. Additionally, a strong lighting device used for meticulous work in a factory irradiates working staff with ultraviolet light and thus is harmful. The present invention is suitably employed as a window material of such a lighting device. Further, the present invention can be used as an art object which emits blue light or light blue-colored light. Furthermore, it can be provided at low cost since it does not use rare metal at all. Additionally, even if a glass is not used as a base material, the material of the present invention can be used in the form of liquid form, gelatinous solid, or resin solid by being sandwiched by polymer materials, such as polystyrene, which is light and has high transparency in the ultraviolet to visible region comparable to that of glass. Therefore, the present invention can be provided at low cost and also can be manufactured in various shapes.

The invention claimed is:

1. A method of shielding ultraviolet light and increasing visible light, the method comprising:
  a first excitation step of exciting a fluorescent material by external light of 200 nm to 330 nm:
  an internal light emission step in which the fluorescent material excited in the first excitation step emits internal light of 330 nm to 400 nm;
  a second excitation step of exciting said or a different fluorescent material by external light of 330 nm to 400 nm and by said internal light of 330 nm to 400 nm; and
  a visible light emission step in which the fluorescent material excited in the second excitation step emits visible light of 400 nm or more,
  wherein an emission peak wavelength $\lambda_1$ of the internal light emitted in the internal light emission step and an excitation wavelength $\lambda_2$ at which an emission peak of the visible light is obtained when the fluorescent material excited in the second excitation step emits the visible light, have a relation $\lambda_1 =$ "$\lambda_2 - 22$" to "$\lambda_2 + 22$".

2. The method of shielding ultraviolet light and increasing visible light according to claim 1, wherein the fluorescent material is a complex or mixture of 4-hydroxycoumarin and aluminum chloride; or a complex or mixture of a compound synthesized from arginine and a coumarin pigment, and aluminum chloride.

3. An ultraviolet-light-shielding and visible-light-increasing material which enables implementation of the method according to claim 1, the ultraviolet-light-shielding and visible-light-increasing material comprising 4-hydroxycoumarin and aluminum chloride, or comprising a compound synthesized from arginine and a coumarin pigment, and aluminum chloride.

4. The ultraviolet-light-shielding and visible-light-increasing material according to claim 3 having 4-hydroxycoumarin and aluminum chloride contained in water, or having the compound synthesized from arginine and a coumarin pigment, and aluminum chloride contained in water.

5. The ultraviolet-light-shielding and visible-light-increasing material according to claim 3, being gelatinous or in resin form.

6. The ultraviolet-light-shielding and visible-light-increasing material according to claim 3, further comprising 2-propanol.

7. An ultraviolet-light-shielding and visible-light-increasing material which enables implementation of the method according to claim 2, the ultraviolet-light-shielding and visible-light-increasing material comprising 4-hydroxycoumarin and aluminum chloride, or comprising a compound synthesized from arginine and a coumarin pigment, and aluminum chloride.

8. The ultraviolet-light-shielding and visible-light-increasing material according to claim 4, being gelatinous or in resin form.

9. The ultraviolet-light-shielding and visible-light-increasing material according to claim 4, further comprising 2-propanol.

10. The ultraviolet-light-shielding and visible-light-increasing material according to claim 5, further comprising 2-propanol.

11. The method of shielding ultraviolet light and increasing visible light according to claim 2, wherein the coumarin pigment is 4-hydroxycoumarin.

12. The ultraviolet-light-shielding and visible-light-increasing material according to claim 3, wherein the coumarin pigment is 4-hydroxycoumarin.

13. The ultraviolet-light-shielding and visible-light-increasing material according to claim 4, wherein the coumarin pigment is 4-hydroxycoumarin.

14. The ultraviolet-light-shielding and visible-light-increasing material according to claim 7, wherein the coumarin pigment is 4-hydroxycoumarin.

15. The method of shielding ultraviolet light and increasing visible light according to claim 11, further comprising 2-propanol.

16. The ultraviolet-light-shielding and visible-light-increasing material according to claim 12, further comprising 2-propanol.

17. The ultraviolet-light-shielding and visible-light-increasing material according to claim 13, further comprising 2-propanol.

18. The ultraviolet-light-shielding and visible-light-increasing material according to claim 14, further comprising 2-propanol.

* * * * *